(12) United States Patent
Zhu et al.

(10) Patent No.: US 7,767,503 B2
(45) Date of Patent: Aug. 3, 2010

(54) HYBRID SOI/BULK SEMICONDUCTOR TRANSISTORS

(75) Inventors: Huilong Zhu, Poughkeepsie, NY (US); Philip J. Oldiges, LaGrangeville, NY (US); Bruce B. Doris, Brewster, NY (US); Xinlin Wang, Poughkeepsie, NY (US); Oleg Gluschenkov, Poughkeepsie, NY (US); Huajie Chen, Danbury, CT (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/132,853

(22) Filed: Jun. 4, 2008

(65) Prior Publication Data

US 2008/0242069 A1 Oct. 2, 2008

Related U.S. Application Data

(62) Division of application No. 11/870,436, filed on Oct. 11, 2007, now Pat. No. 7,452,761, which is a division of application No. 10/708,378, filed on Feb. 27, 2004.

(51) Int. Cl.
*H01L 21/84* (2006.01)
*H01L 21/336* (2006.01)

(52) U.S. Cl. .................. 438/151; 438/299; 257/E21.54

(58) Field of Classification Search ................. 438/151, 438/299; 257/E21.54
See application file for complete search history.

(56) References Cited

U.S. PATENT DOCUMENTS 3,602,841 A 8/1971 McGroddy
4,665,415 A 5/1987 Esaki et al.
4,853,076 A 8/1989 Tsaur et al.
4,855,245 A 8/1989 Neppl et al.

(Continued)

FOREIGN PATENT DOCUMENTS

JP 64-76755 3/1989

(Continued)

OTHER PUBLICATIONS

Kern Rim, et al., "Transconductance Enhancement in Deep Submicron Strained-Si n-MOSFETs". International Electron Devices Meeting, 26, 8, 1, IEEE, Sep. 1998.

(Continued)

*Primary Examiner*—Ngan Ngo
(74) *Attorney, Agent, or Firm*—Whitham, Curtis, Christofferson & Cook, P.C.; Joseph P. Abate

(57) ABSTRACT

Channel depth in a field effect transistor is limited by an intra-layer structure including a discontinuous film or layer formed within a layer or substrate of semiconductor material. Channel depth can thus be controlled much in the manner of SOI or UT-SOI technology but with less expensive substrates and greater flexibility of channel depth control while avoiding floating body effects characteristic of SOI technology. The profile or cross-sectional shape of the discontinuous film may be controlled to an ogee or staircase shape to improve short channel effects and reduce source/drain and extension resistance without increase of capacitance. Materials for the discontinuous film may also be chosen to impose stress on the transistor channel from within the substrate or layer and provide increased levels of such stress to increase carrier mobility. Carrier mobility may be increased in combination with other meritorious effects.

7 Claims, 27 Drawing Sheets

U.S. PATENT DOCUMENTS

| | | |
|---|---|---|
| 4,952,524 A | 8/1990 | Lee et al. |
| 4,958,213 A | 9/1990 | Eklund et al. |
| 5,006,913 A | 4/1991 | Sugahara et al. |
| 5,060,030 A | 10/1991 | Hoke et al. |
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,015,761 A | 1/2000 | Merry et al. |
| 6,025,280 A | 2/2000 | Brady et al. |
| 6,046,464 A | 4/2000 | Schetzina |
| 6,051,509 A * | 4/2000 | Tsuchiaki .................. 438/758 |
| 6,066,545 A | 5/2000 | Doshi et al. |
| 6,090,684 A | 7/2000 | Ishitsuka et al. |
| 6,091,123 A | 7/2000 | Krivokapic et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,294,817 B1 | 9/2001 | Srinivasan et al. |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,399,961 B1 | 6/2002 | Blanchard |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,621,392 B1 | 9/2003 | Volant et al. |
| 6,635,506 B2 | 10/2003 | Volant et al. |
| 6,657,258 B2 | 12/2003 | Bae |
| 6,787,852 B1 | 9/2004 | Yu et al. |
| 6,858,528 B2 | 2/2005 | Meagley et al. |
| 6,936,522 B2 * | 8/2005 | Steegen et al. ............... 438/426 |
| 7,176,073 B2 * | 2/2007 | Bhattacharyya .............. 438/157 |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2004/0026736 A1 * | 2/2004 | Grupp et al. ................. 257/330 |
| 2005/0098828 A1 | 5/2005 | Wang |
| 2006/0292744 A1 * | 12/2006 | Enquist et al. ............... 438/107 |
| 2007/0026591 A1 * | 2/2007 | Grupp et al. ................. 438/194 |

OTHER PUBLICATIONS

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors- Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitride Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

H.S. Momose, et al., "Temperature Dependence of Emitter-Base Reverse Stress Degradation and its Mechanism Analyzed by MOS Structures." Paper 6.2, pp. 140-143, IEEE 1989.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

* cited by examiner

HYBRID SOI/BULK SEMICONDUCTOR TRANSISTORS

CROSS-REFERENCE TO RELATED APPLICATIONS

This application is a division of U.S. patent application Ser. No. 11/870,436. filed Oct. 11, 2007 now U.S. Pat No. 7,452,761, which is a division of U.S. patent application Ser. No. 10/708,378, filed Feb. 27, 2004, and which are incorporated herein by reference.

BACKGROUND OF THE INVENTION

1. Field of the Invention

The present invention generally relates to high performance transistors suitable for manufacture at very high density in integrated circuits and, more particularly, to transistors formed with performance enhancing structures below the gates thereof.

2. Description of the Prior Art

The potential for improved performance, functionality and economy of manufacture has driven continual increases in integration density of integrated circuits and reduction of size of individual transistors therein. However, the electrical characteristics of transistors are difficult to maintain when fabricated at smaller feature sizes. For example, in field effect transistors (FETs), short channel effects and punch-through, differences in conduction between nFET and pFET devices and differences of impurity diffusion rates have led to sophisticated impurity structures and profiles to control the field in and adjacent to the channel and below the gate to manipulate the channel geometry and maintain acceptable on/off resistance ratios at low control voltages (e.g. below breakdown thresholds which are reduced at reduced dimensions).

Another technique of regulating channel dimensions, particularly channel depth, and junction capacitance (which, in bulk semiconductor devices is large and degrades switching speed) is through use of silicon-on-insulator (SOI) or ultra-thin silicon-on-insulator (UT-SOI) substrates on which the transistors are formed. UT-SOI technology can avoid the problem that, in bulk semiconductor devices at small sizes, the channel is too deep to allow adequate control of short channel effects. However, the thin silicon layer in SOI devices and UT-SOI device, in particular, causes increased resistance which is very difficult to reduce without a trade-off of increased susceptibility to short channel effects, particularly between nFETs and pFETs in complementary (e.g. CMOS) circuits due to differences in diffusivity of boron and arsenic or phosphorus and which generally require different setbacks or recess differences of source/drain and extension regions for optimal nFET and PFET designs that are not generally practical to provide. Also, the insulator layer in SOI substrates prevents effective electrical connection to the channel regions and results in floating body effects which can unpredictably alter the switching threshold of transistors. Further, UT-SOI wafers are far more expensive than bulk semiconductor wafers and significantly increase the cost of manufacture of integrated circuit chips.

A known technique for reducing resistance in thin SOI film transistors is to provide a raised source and drain (RSD) structure by growth of additional semiconductor material in the source and drain regions. However, RSD structures are generally formed adjacent a thin spacer on the sides of the transistor gate and increase the overlap capacitance (the capacitance between the extension impurity region and the gate electrode across the gate dielectric and thin spacer) significantly; degrading transistor performance. Typical capacitance increases for a 30 nm RSD are about 0.08 fF/μm (about 25% increase) for a 10 nm oxide spacer and about 0.2 fF/μn (about 50% increase) for a 10 nm nitride spacer. Additionally, the minimal thickness of the spacer appropriate to reducing resistance through the use of RSD structures places the source/drain implants too close to the gate.

It is also known that electrical properties may vary substantially between pFET and nFET devices due to differences in carrier mobility. It is also known that carrier mobility can be altered by application of tensile or compressive stresses to a volume of semiconductor material. However, the application of stresses to transistor designs without causing other undesirable effects such as warping of the chip is difficult and complicated even when the stress is applied from a stressed film formed over a conventional transistor design. It has only recently become practical to provide both tensile and compressive films at respective locations on the same chip. Further, forces applied from films formed over or even around transistor structures transfer forces to a semiconductor substrate or layer indirectly in shear (causing opposite stressing of adjacent regions) and the pattern of forces within a substrate or other semiconductor layer rapidly diminish with depth and are difficult to regulate while being more likely to cause chip warping. No technique is known for developing controlled tensile or compressive forces within a semiconductor substrate or layer to directly stress a desired region within that semiconductor substrate or layer.

SUMMARY OF THE INVENTION

It is therefore an object of the present invention to provide a field effect transistor structure having a discontinuous insulator or semiconductor layer formed within a semiconductor layer or substrate with a discontinuity such as an aperture or film portion aligned with a gate structure of the transistor and which can be fabricated on a bulk semiconductor wafer while having desirable properties similar to transistors fabricated on SOI or UT-SOI wafers but without high resistance, floating body and other undesirable effects associated with SOI technology and UT-SOI technology, in particular.

It is another object of the invention to provide a hybrid bulk semiconductor-SOI transistor structure and methodology for forming various insulator structures within a substrate or layer of semiconductor material at a desired depth and self-aligned with the transistor gate to increase uniformity and manufacturing yield.

It is a further object of the present invention to provide carrier mobility enhancements by developing stressed regions within a semiconductor substrate.

In order to accomplish these and other objects of the invention, field effect transistor and/or an integrated circuit including a transistor is provided wherein the transistor is formed at a surface of a layer of semiconductor material and comprises a gate structure formed on the surface of the layer of semiconductor material, and a discontinuous film of material within the layer of semiconductor material and having a discontinuity aligned and, preferably, self-aligned with the gate structure of the transistor.

In accordance with another aspect of the invention, a method of forming a hybrid field effect transistor or integrated circuit is provided comprising steps of forming a gate structure, forming a discontinuous layer having a discontinuity aligned with the gate structure within a layer of semiconductor material underlying the gate structure. Material within and/or surrounding the discontinuity may be conductive or insulative and may or may not be stressed (tensile or compressive).

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
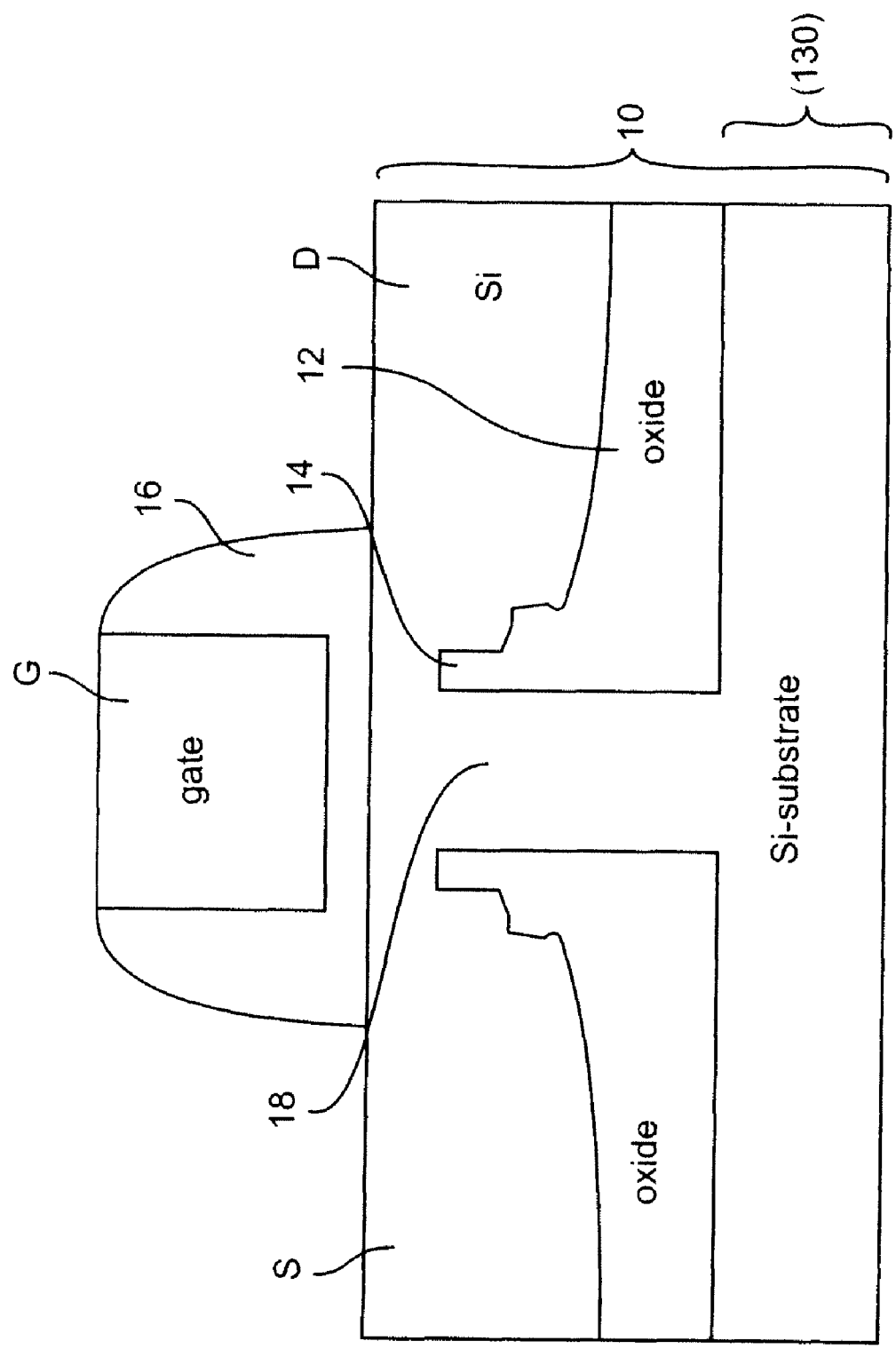
FIG. 1 is a cross-sectional view of a generalized form of the invention.

Referring now to the drawings, and more particularly to FIG. 1, there is shown a cross-sectional view of a transistor in accordance with a generalized form of the invention. It will be appreciated by those skilled in the art that some aspects of the transistor illustrated in FIG. 1, such as a gate G formed on a substrate 10 and having sidewalls 16 to locate source S and drain D implants and extension implants, resemble known transistors and, indeed, the invention may be applied to virtually all known field effect transistor (FET) designs. Conversely, it will be recognized by those skilled in the art that the transistor of FIG. 1 provides a structure 12 within the substrate which may be shaped to include a region 14 close to the substrate surface, preferably in a "staircase" profile, as illustrated (which improves short channel effects and reduces source/drain and extension resistance, and which defines a region 18 centrally positioned below gate G and which may be of smaller transverse dimensions than the gate G (e.g. of sub-lithographic dimensions, assuming that gate G is formed at the minimum feature size that can be resolved with a given lithographic exposure tool). Depending on materials used to form structure 12, numerous desirable features may be formed singly or in combination to enhance the transistor design, as will be discussed in greater detail below in regard to several exemplary embodiments; from which those skilled in the art will be enabled to derive other advantageous variants of the invention.

For example, if structure 12 is formed of an oxide or other insulator, a bulk semiconductor wafer can be effectively converted into a hybrid wafer having many of the beneficial properties generally associated with a silicon-on-insulator (SOI) wafer but with substantial cost savings and with the added advantages that the depth of structure 12 can be varied at will to define the thickness of the conduction channel of the transistor and floating body effects can be avoided. Further, the shaping of structure 12 may be readily controlled, for example, to form region 14 which may be used to shape structure 12 in, for example, a "staircase" cross-sectional profile can be used to emulate an UT-SOI wafer in regard to the confinement of channel depth with the additional advantage that a greater thickness of semiconductor material may be provided for source and drain structures that would not be available on a SOI or UT-SOI wafer. Further, the patterning of structure 12, which may be performed in a manner self-aligned with the gates, provides a further region 18 which can be used, for example, to provide a conduction path to the channel to prevent floating body effects, alluded to above, or other desired effects or structures such as a further gate to provide a dual-gate FET and/or to localize stresses applied from a stressed film which can enhance carrier mobility.

Referring now to FIGS. 2-8, fabrication of a first embodiment of the invention will now be discussed. This first embodiment will be referred to as featuring a self-aligned, recessed source and drain which provides low resistance and the possibility of silicided contacts while allowing confinement of the channel to a very shallow depth and a very sharp lateral diode junction by blocking diffusion from the source and drain regions to improve short channel effects. This geometry, achieved using a low cost bulk semiconductor wafer, also allows junction capacitance to be reduced and held to a low level while avoiding increase of overlap capacitance.

Figure 2:
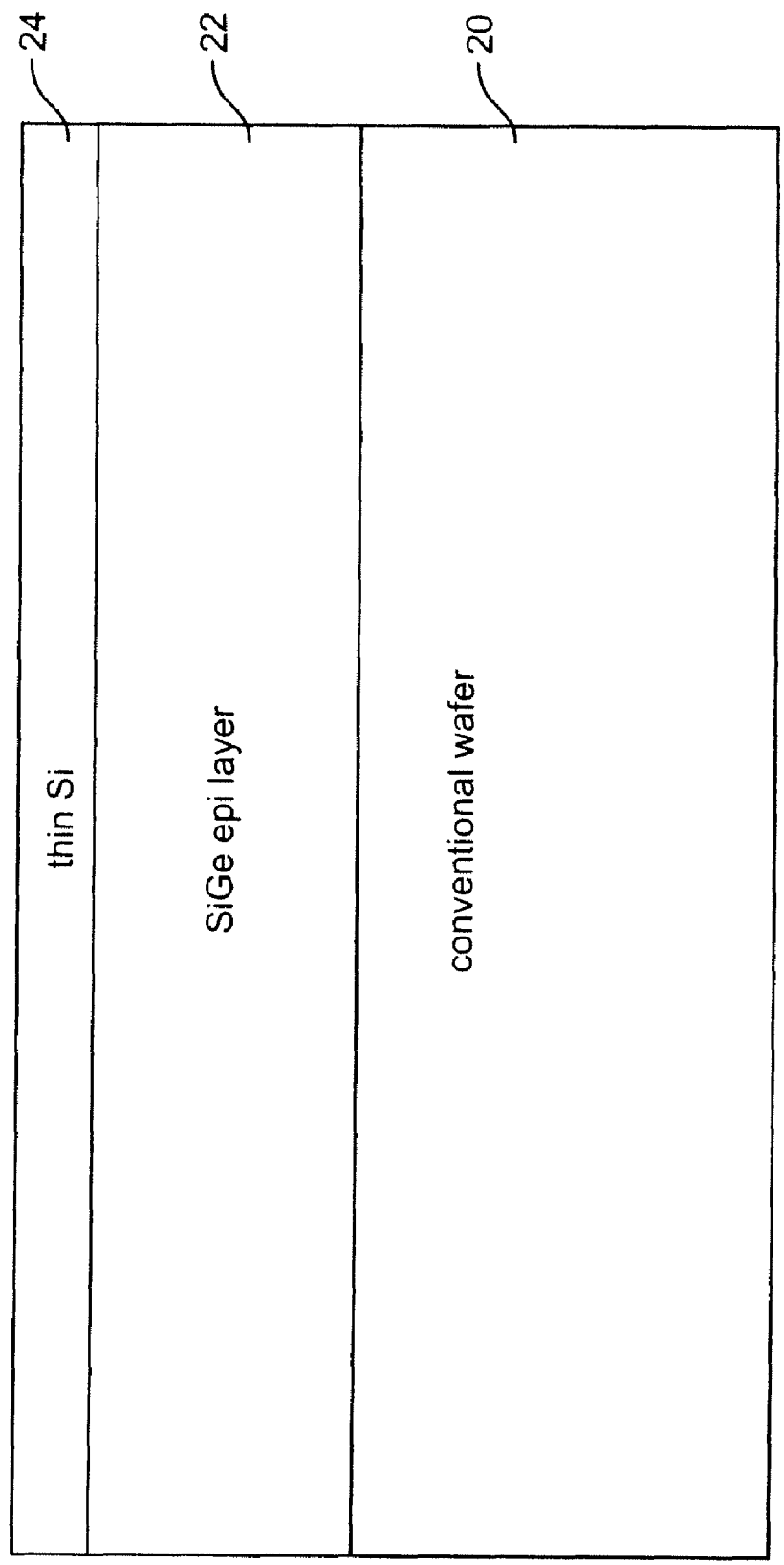
FIGS. 2, 3, 4, 5, 6, 7 and 8 are cross-sectional views representing steps in the formation of a first embodiment of the invention.

Referring now to FIG. 2, fabrication of the first preferred embodiment of the invention begins with a bulk semiconductor (e.g. silicon) wafer 20 which is much less expensive than a SOI wafer. However, a SOI wafer or other types of wafer can also be used and may provide additional advantages in some designs. A low fraction silicon-germanium (SiGe) alloy layer is then epitaxially grown on a surface of the wafer using any known technique. The fraction of germanium is not critical to the practice of the invention and a 10% germanium content is entirely adequate to the practice of the invention. Other materials may also be suitable since the principal function of the alloy is to provide differential oxide formation as will be discussed below in connection with FIG. 5. The thickness of the SiGe layer is also not critical to the practice of the invention and variation thereof may be useful in forming structure 12 in a desired shape. A thickness of 20-50 nm has been found adequate for fabrication of a transistor in accordance with the first preferred embodiment of the invention. Then, a thin layer 24 of epitaxial silicon or other semiconductor is formed over layer 22 to a non-critical thickness preferably approximating the desired depth to which the conduction channel of the transistor is to be confined.

Figure 3:
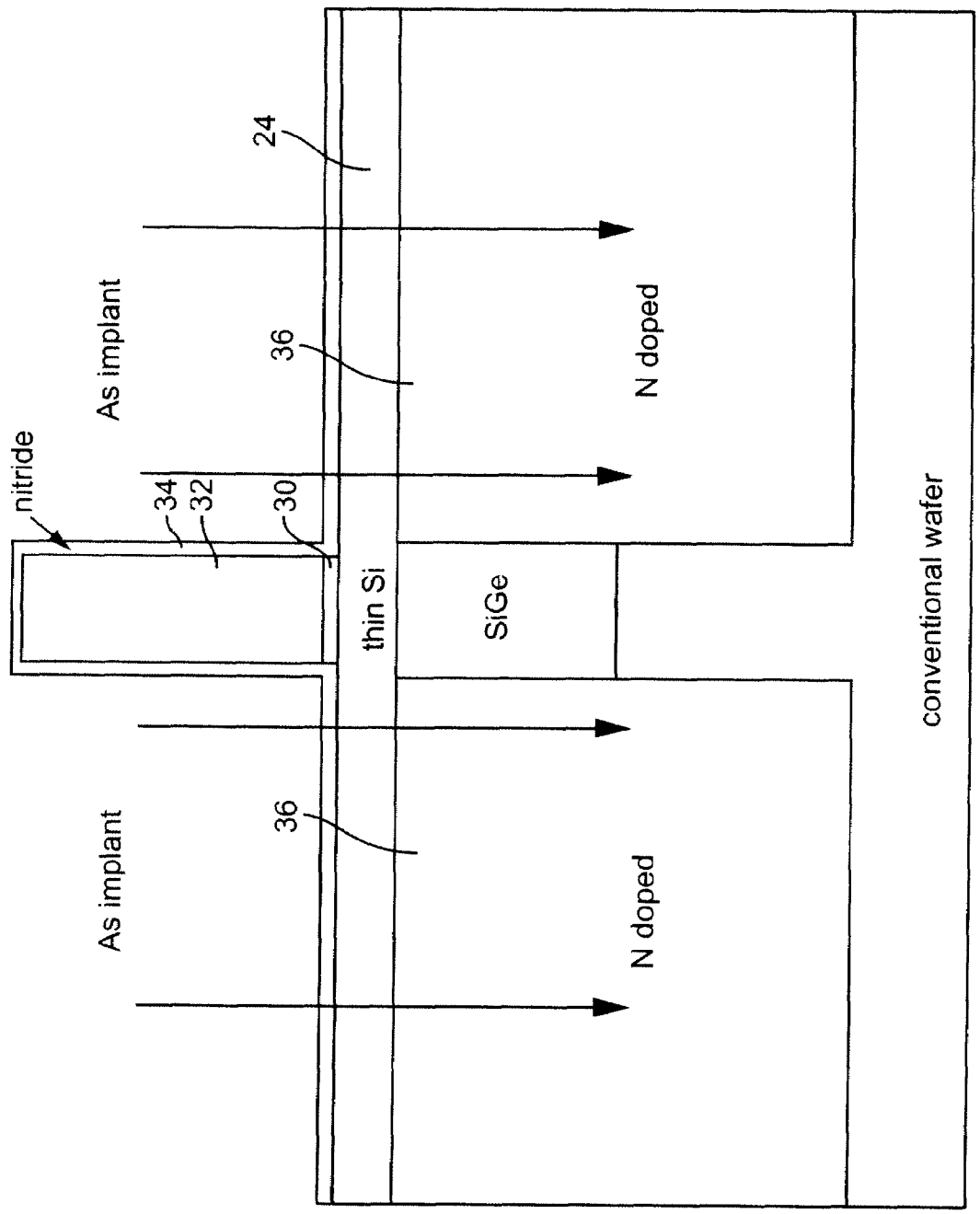

As shown in FIG. 3, the gate structure G, including a gate oxide 30, gate electrode 22 and nitride protective layer 34 are formed by any known technique. This gate structure may be sacrificial and may be removed and replaced after use as a hard mask but it is preferred, for process simplicity and overlay accuracy, that the structure be retained as the final transistor gate structure. Then, using the gate structure as a mask, arsenic is implanted to a depth exceeding the thickness of the SiGe layer (e.g. at an energy range such that impurities are implanted through the thin nitride 34 and thin silicon 24 and extend throughout the SiGe layer and well into the underlying semiconductor layer).

Figure 4:
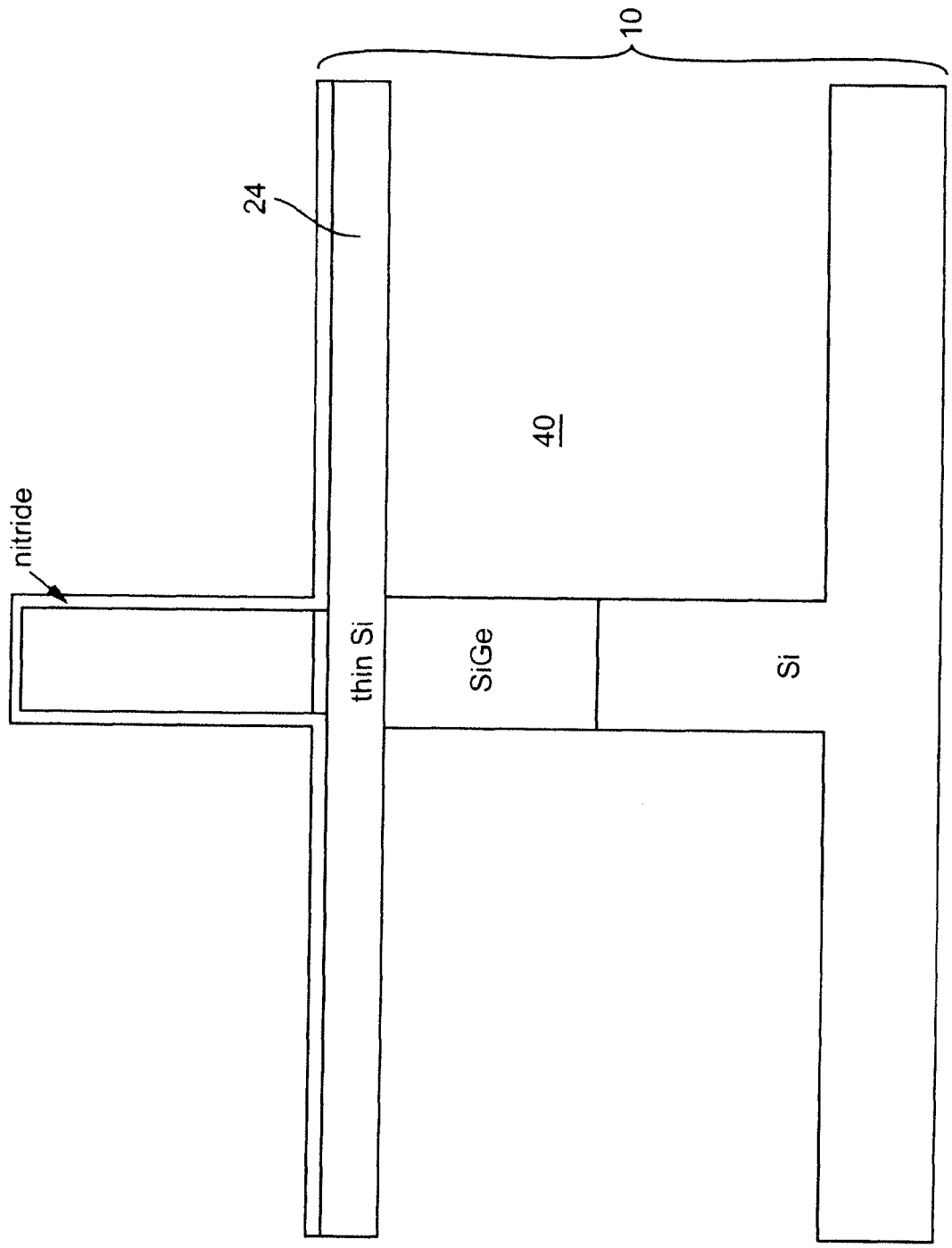

As shown in FIG. 4, a trench is opened by any known technique at any convenient location such as at the sides of the transistor, as shown, and which may advantageously be co-located with an isolation structure. After annealing, the implanted silicon is then selectively etched away by a timed etch process; the implanted silicon having a significantly higher etch rate. This process leaves voids within the semiconductor wafer or layer 10 where layers 20 and 22 are removed while leaving some portion of layer 20 and layer 24 intact.

Figure 5:
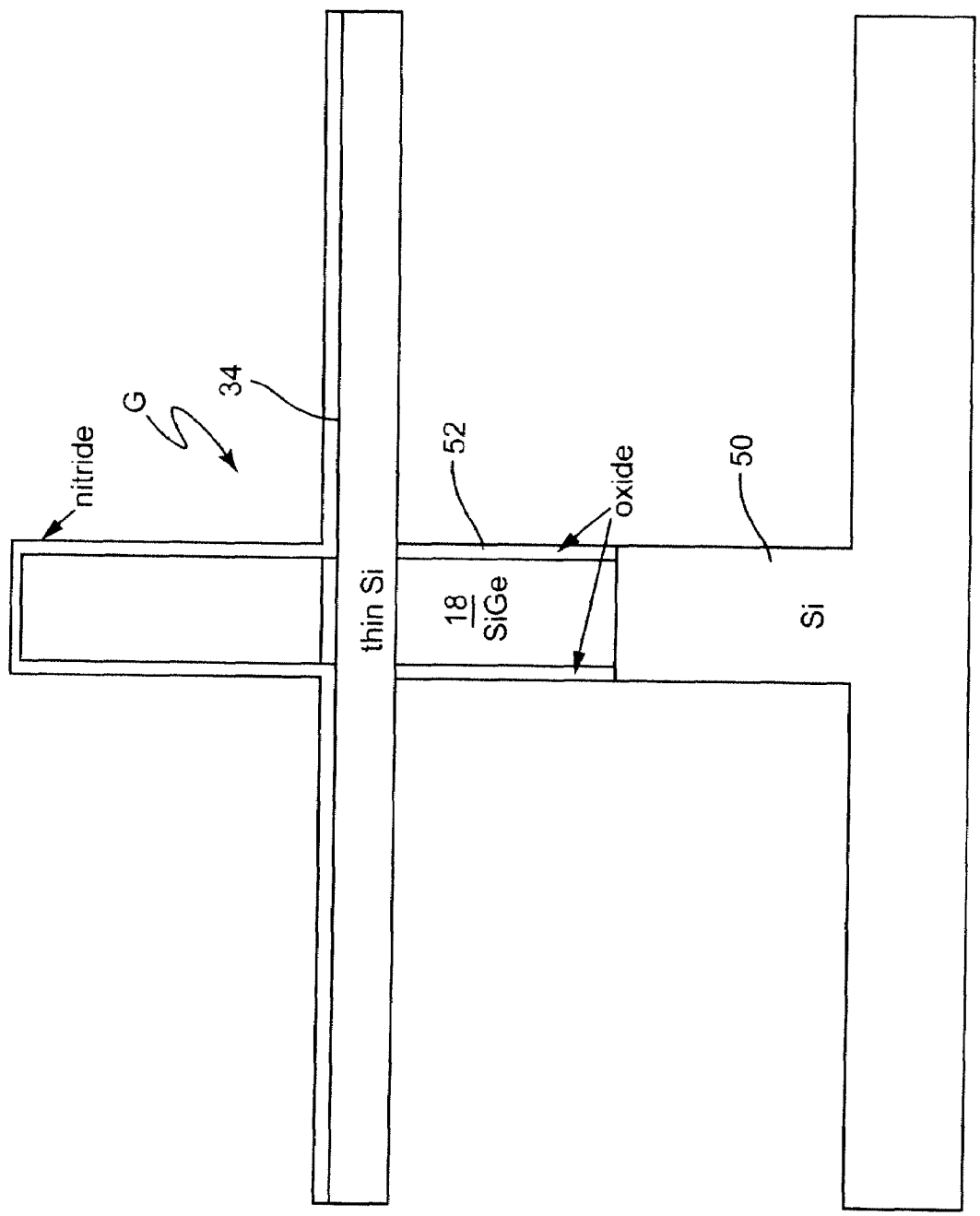

As shown in FIG. 5, the structure of FIG. 4 is selectively oxidized and the resulting oxide is etched selectively to the nitride layer. Since the oxidation rate of SiGe is about 3.5 times that of oxidation of silicon, relatively more of the SiGe will be oxidized. The etch rate, however, is substantially the same for oxidized silicon and oxidized SiGe and oxide is left only in regions where SiGe was exposed by the process of FIG. 4 and a greater thickness of oxide formed. It should also be noted that this oxide is formed under the gate structure G while being located in a self-aligned manner using the gate structure as a mask. Therefore, region 18 is smaller than the gate structure G and may be of sub-lithographic dimensions. While this dimension is not critical to the practice of the invention, it may be important to a given transistor design since region 18 forms an electrical contact to the channel of the transistor to avoid floating body effects and the resistance of this region should generally be considered in the course of design of the transistor. Dimensions of region 18 may be readily controlled in accordance with the gate structure dimensions and the duration of the oxidation process to determine the thickness of oxide and remaining semiconductor within the gate dimensions.

Figure 6:
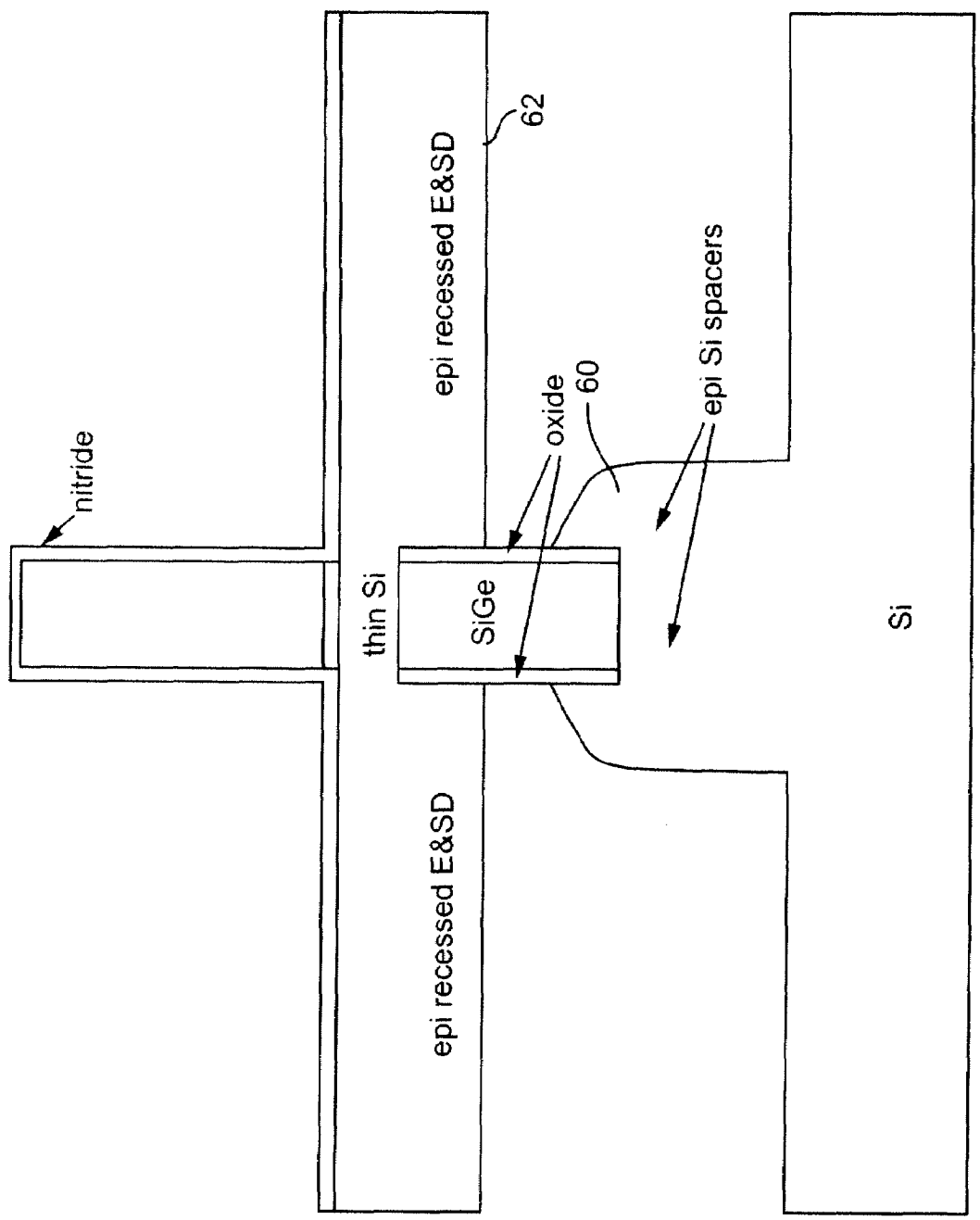
Figure 7:
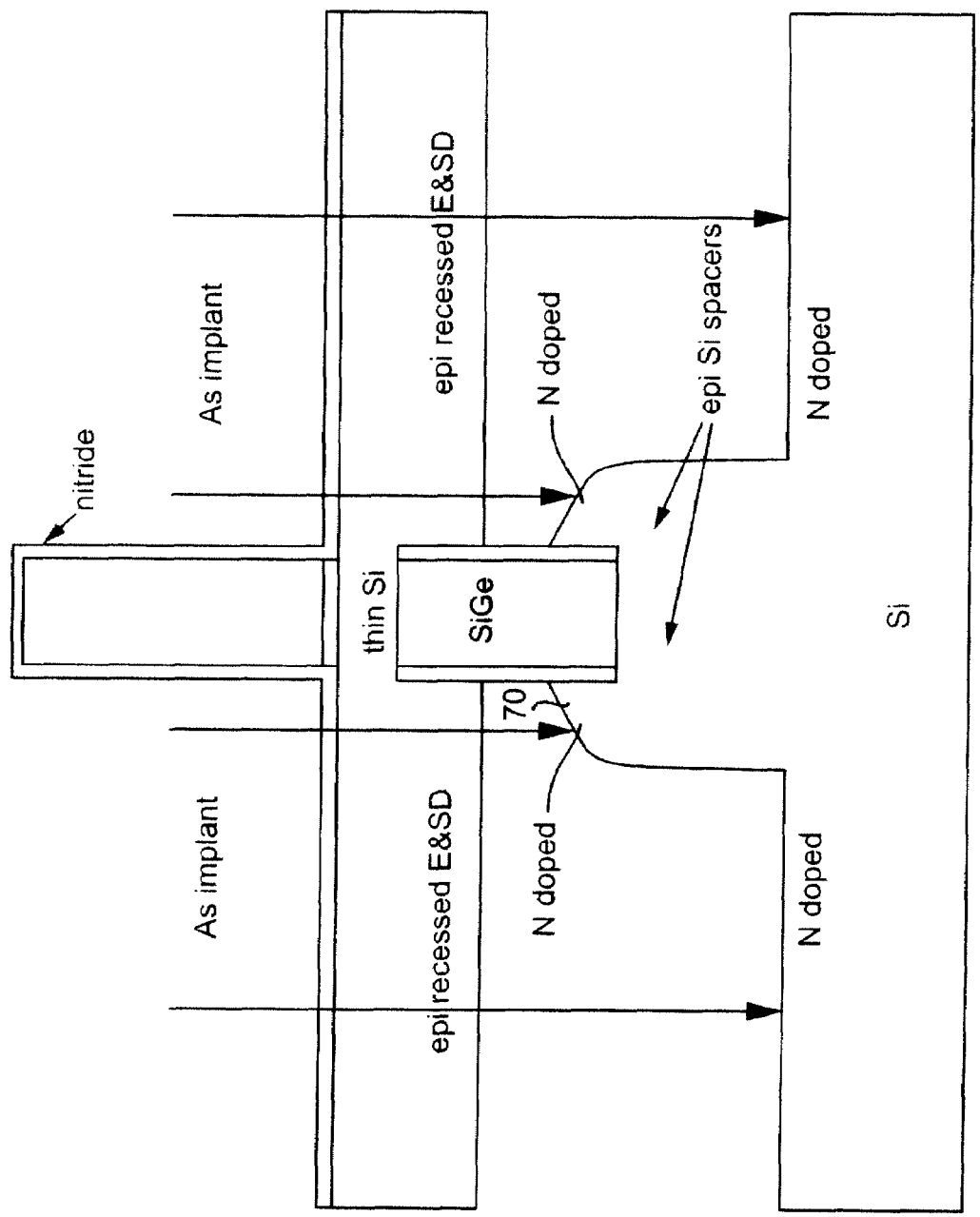
Figure 8:
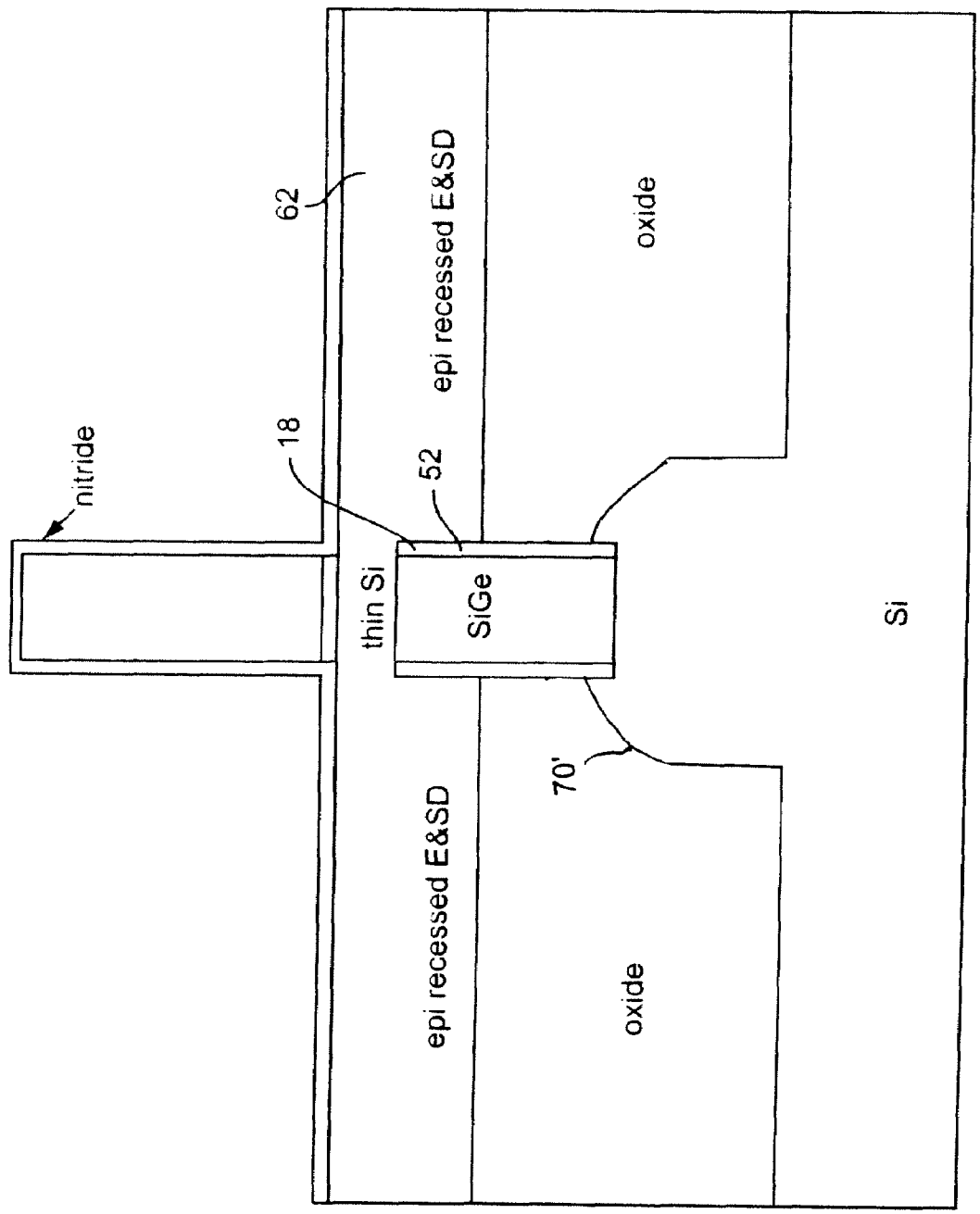

It should also be noted from FIG. 5 that silicon is exposed at the sides of region 50. As shown in FIG. 6, silicon may then be epitaxially grown thereon. Silicon will not be grown on the oxide covering the SiGe but growth starting from region 50 may extend over a portion thereof to form spacers 60. Further, epitaxial silicon growth occurs on the exposed silicon on the back surface of thin silicon layer 24 to form recessed extension and source and drain (E&SD) regions 62. Then, as shown in FIG. 7, a further arsenic implant and annealing are optionally but preferably performed, followed by a selective (to undoped silicon) etching process to be certain of avoiding shorting of the grown silicon spacer and the recessed E&SD regions. Since the silicon is selectively grown from exposed silicon but not oxide, any grown silicon (e.g. 70) which might connect these regions will be thinner over the oxide and can be readily removed by etching (e.g. to profile 70' of FIG. 8). Then, as shown in FIG. 8 the void is filled with deposited oxide; yielding a discontinuous oxide film having a cross-sectional shape similar to that of regions 12 of FIG. 1 and apertures aligned with the gate structure of the transistor. This structure yields a transistor (when completed by self-aligned extension, source/drain and/or halo implants and contact formation by any known processes) with a well confined shallow channel and sharp lateral junction due to the confinement of impurity diffusion by the upper end of oxide 52. At the same time, the thickness of the recessed E&SD 62 may be made substantially greater than the channel depth to reduce or limit resistance. An ohmic connection of controllable resistance to the channel region is also formed at the apertures in the insulating film to avoid floating body effects with an arbitrarily small effect on the transistor performance since the resistance of connection 18 can be made readily controlled by control of the dimensions of the connection.

Accordingly, it is seen that the invention provides for a structure of relatively arbitrary cross-sectional shape and materials to be developed within a layer of semiconductor material such as a bulk semiconductor wafer and which can impart useful and desirable characteristics to a transistor or other active device while potentially reducing the cost thereof. In the case of the first preferred embodiment described above, a recessed extension and source-drain structure allows a shallow channel such as might be obtained from a SOI wafer in a much less expensive layer or wafer of bulk silicon while obtaining the further advantages of reduced resistance and/or overlap capacitance and avoiding the floating body effects incident to SOI FET structures. Another, second group of beneficial and desirable effects can be obtained in accordance with a second preferred embodiment of the invention which will now be discussed in connection with FIGS. 9-20.

It is now recognized that carrier (electron or hole) mobility in a semiconductor material can be enhanced by the application of stress to the semiconductor material. As can be readily understood, an increase in carrier mobility reduces resistance of the material. In general, a compressive stress increases hole mobility but decreases electron mobility while tensile stresses increase electron mobility while decreasing hole mobility when stress is less than about 1.5 GPa. Therefore, while some techniques of imposing persistent tensile and compressive stress have been recently developed, it is difficult to selectively provide localized tensile and compressive stresses, particularly for complementary MOSFETS and gains in performance of pFETs are generally accompanied by deleterious effects in nFETs and vice-versa although this difficulty has recently been overcome, to a degree, by surface applications of tensile and compressive films over transistor structures as disclosed for example in U.S. patent application Ser. Nos. 10/695,748 and 10/695,752, both assigned to the assignee of the present invention and hereby fully incorporated by reference herein. Unfortunately, surface applications of stressed films do not transfer stresses to the conduction channel with optimal efficiency and, in particular, to the relatively high resistance regions of the conduction channel under the spacers and adjacent the transistor gate where very high stresses are required for significant improvement in transistor characteristics to be achieved. Moreover, the higher stresses required in the surface film and outside the substrate may cause other deleterious effects such as chip curling or cracking, loss of film adhesion and the like.

Figure 9:
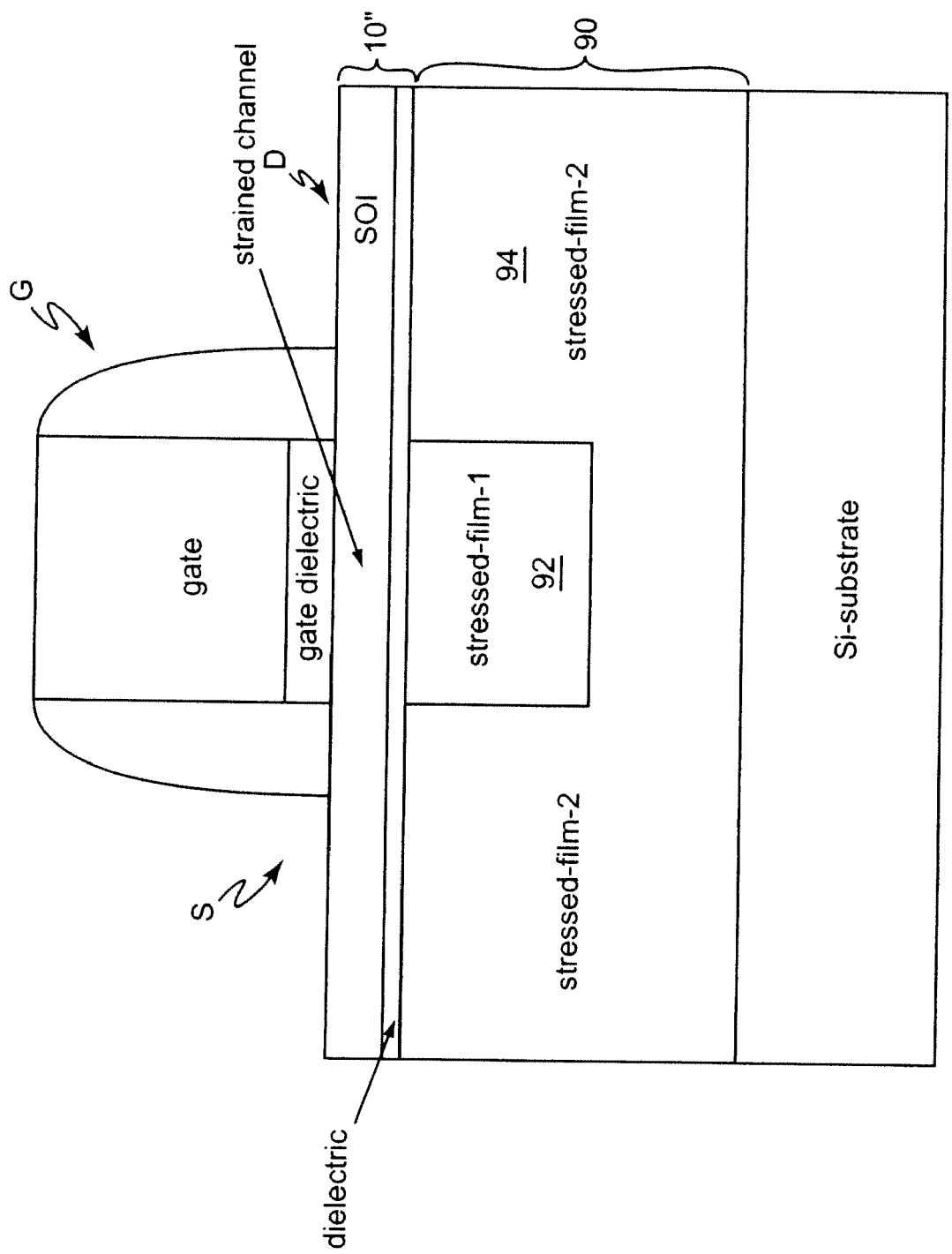
FIG. 9 is a generalized cross-sectional view of a second embodiment of the invention.

Referring now to FIG. 9 a generalized cross-sectional view of a second preferred embodiment for applying stresses within the substrate or layer of semiconductor material is shown. It may be helpful to an appreciation of the scope of the present invention to compare FIG. 9 with FIG. 1, discussed above. In particular, the second preferred embodiment provides a discontinuous insulator film structure within a portion of a substrate underlying a transistor and having discontinuities aligned (e.g. self-aligned) with the gate thereof and lying below the conduction channel of the transistor. However, the discontinuous film is a stressed film aligned with and underlying the gate structure rather than having an aperture aligned with the gate and a second stressed insulator film is also preferably included to enhance the effects of the first film in providing further increased stress in the channel. It will also be observed by those skilled in the art that FIG. 9 illustrates a transistor formed on a SOI or UT-SOI layer but will also recognize from the following description that the structure in accordance with the second preferred embodiment can be applied to any known transistor design in any semiconductor layer or in a bulk semiconductor substrate or even below the hybrid SOI-bulk semiconductor structure of FIG. 1 (with a suitable connection provided for connection 18 thereof). The SOI structure is illustrated in FIG. 9 principally to emphasize that the stressed film layer 90 is below the depth to which the transistor extends and it should be understood that the region 10' could comprise substrate 10 of FIG. 1 (in which oxide region 14 confines the effective transistor depth) and should be considered as representative thereof as well as of an SOI structure. It will also be appreciated that while oxide regions 14/52 of the first embodiment are within the dimensions of the gate and smaller than the transverse dimensions of the gate as an incident of the growth of oxide 52 which may be controlled to advantage, as described above, while the first stressed film 92 is more exactly aligned with the gate (and advantageously so), it will be appreciated that the alignment of the structure with the gate is preferably achieved in regard to both structures in a manner self-aligned with the gate and the principal differences of shape and materials of the structure within the substrate should be considered as exemplary while other shapes and materials may be advantageously used to engender other desired device features, as will be apparent to those skilled in the art in view of the respective descriptions thereof. Again, the gate, G, source, S, and drain, D, structures shown are also exemplary and non-critical in FIG. 9 and it should be understood that the embodiment of FIG. 9 can be applied to any transistor design to increase carrier mobility.

Figure 10:
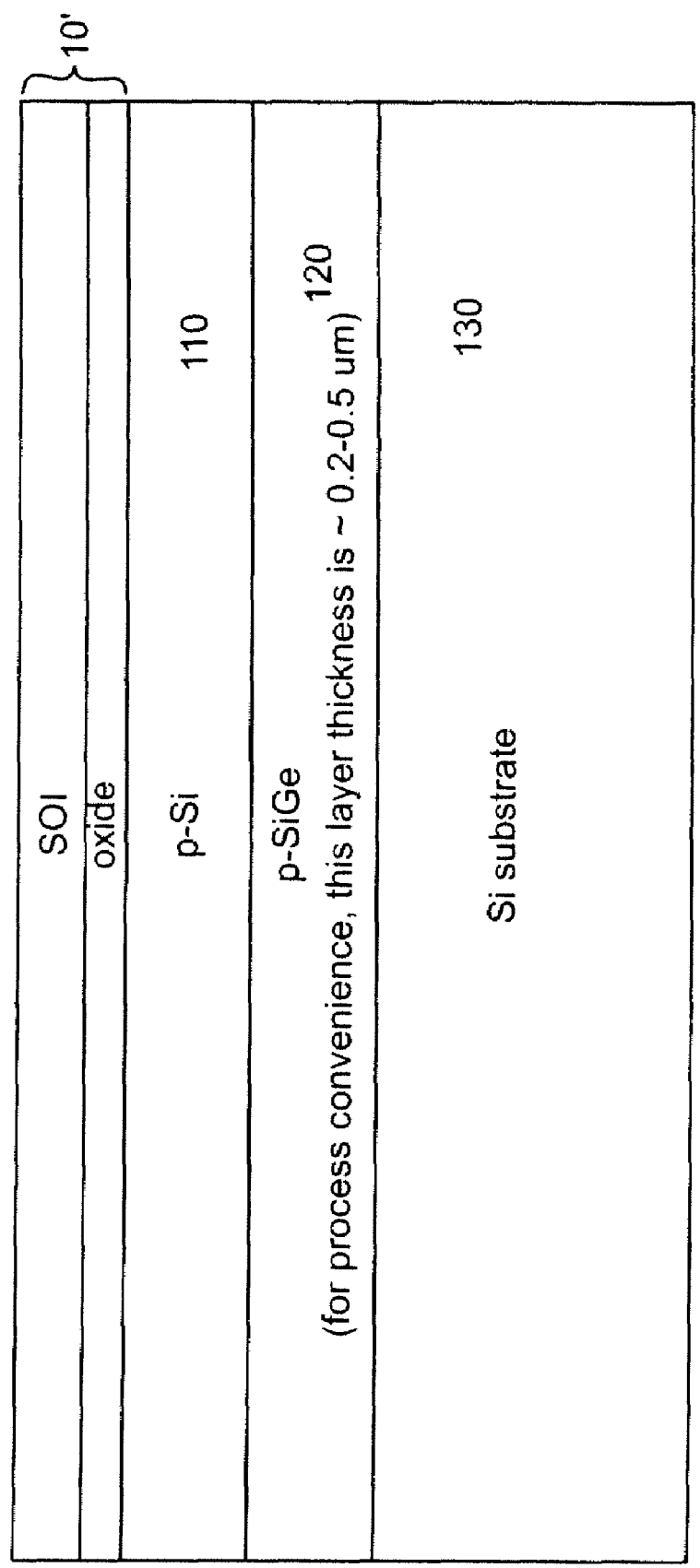
FIGS. 10, 11, 12, 13, 14, 15, 16, 17, 18 and 19 are cross-sectional views illustrating fabrication of the structure of FIG. 9, FIGS. 20, 21, 22, 23, 24, 25A and 25B (FIGS. 25A and 25B depicting alternative processes for forming SOI or SON or bulk devices, respectively) are cross-sectional view illustrating formation of a third embodiment of the invention, and FIG. 26 graphically illustrates the stress levels achieved by variant forms of the third embodiment of the invention.
Figure 11:
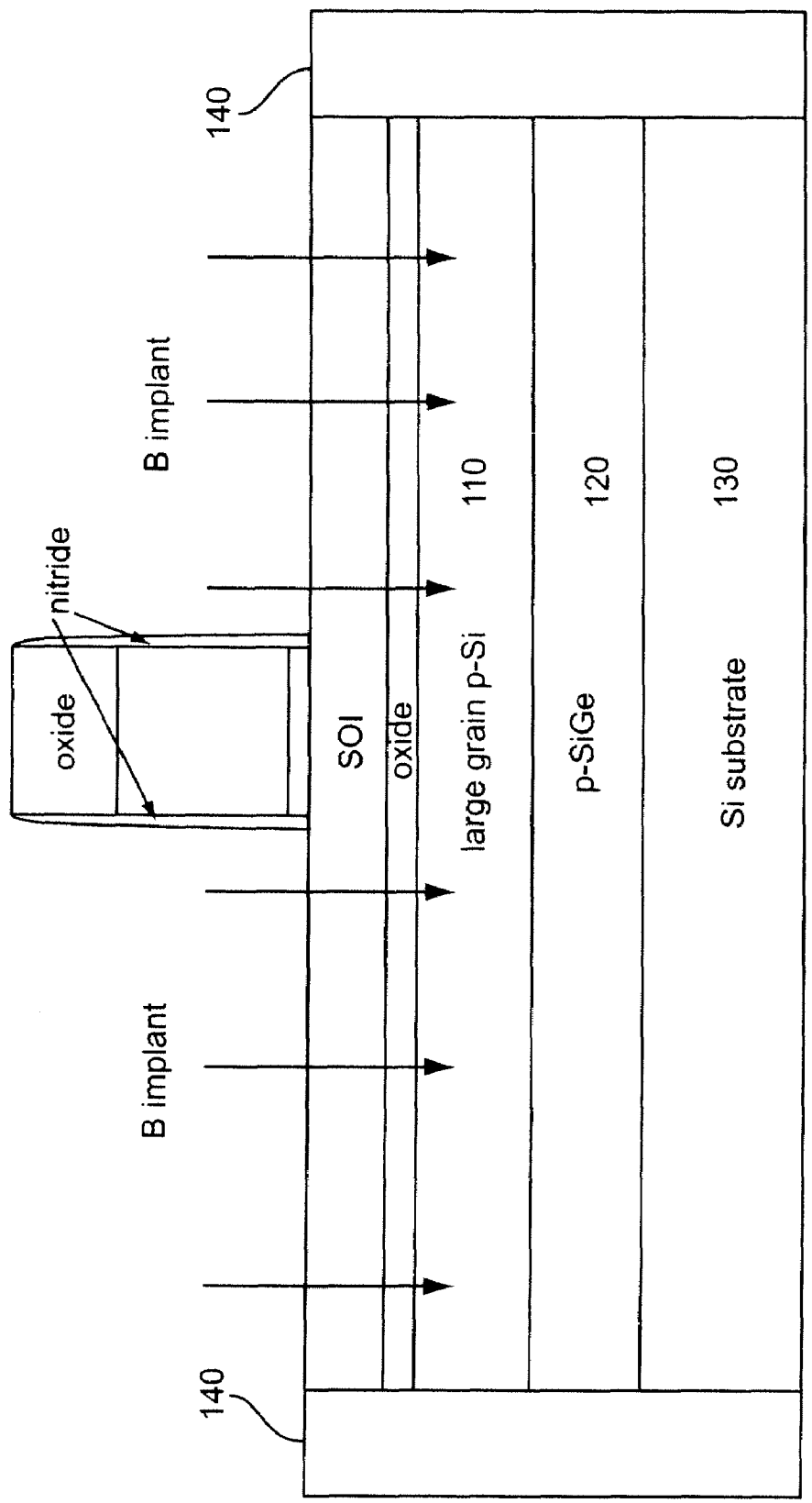
Figure 12:
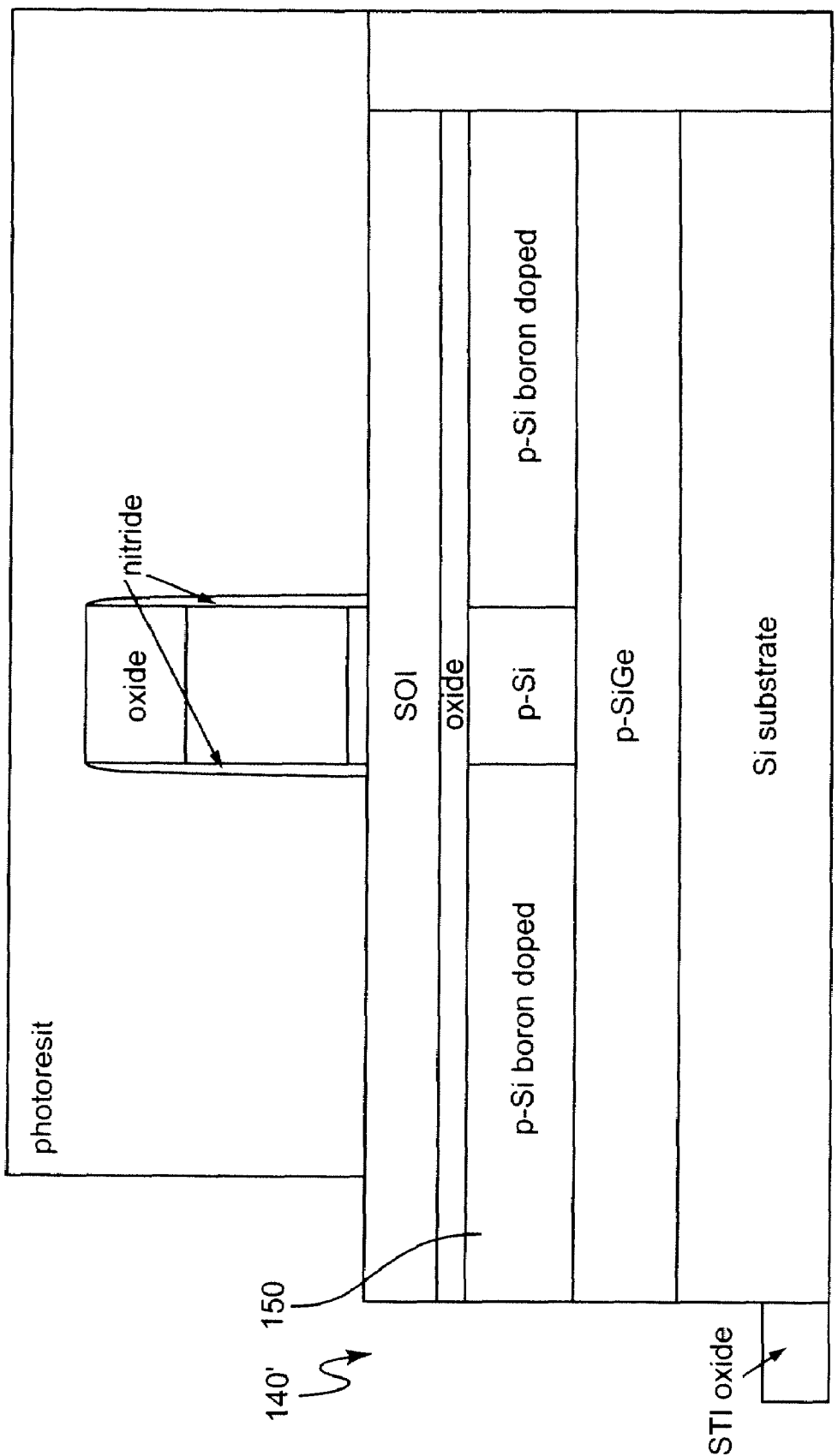
Figure 13:
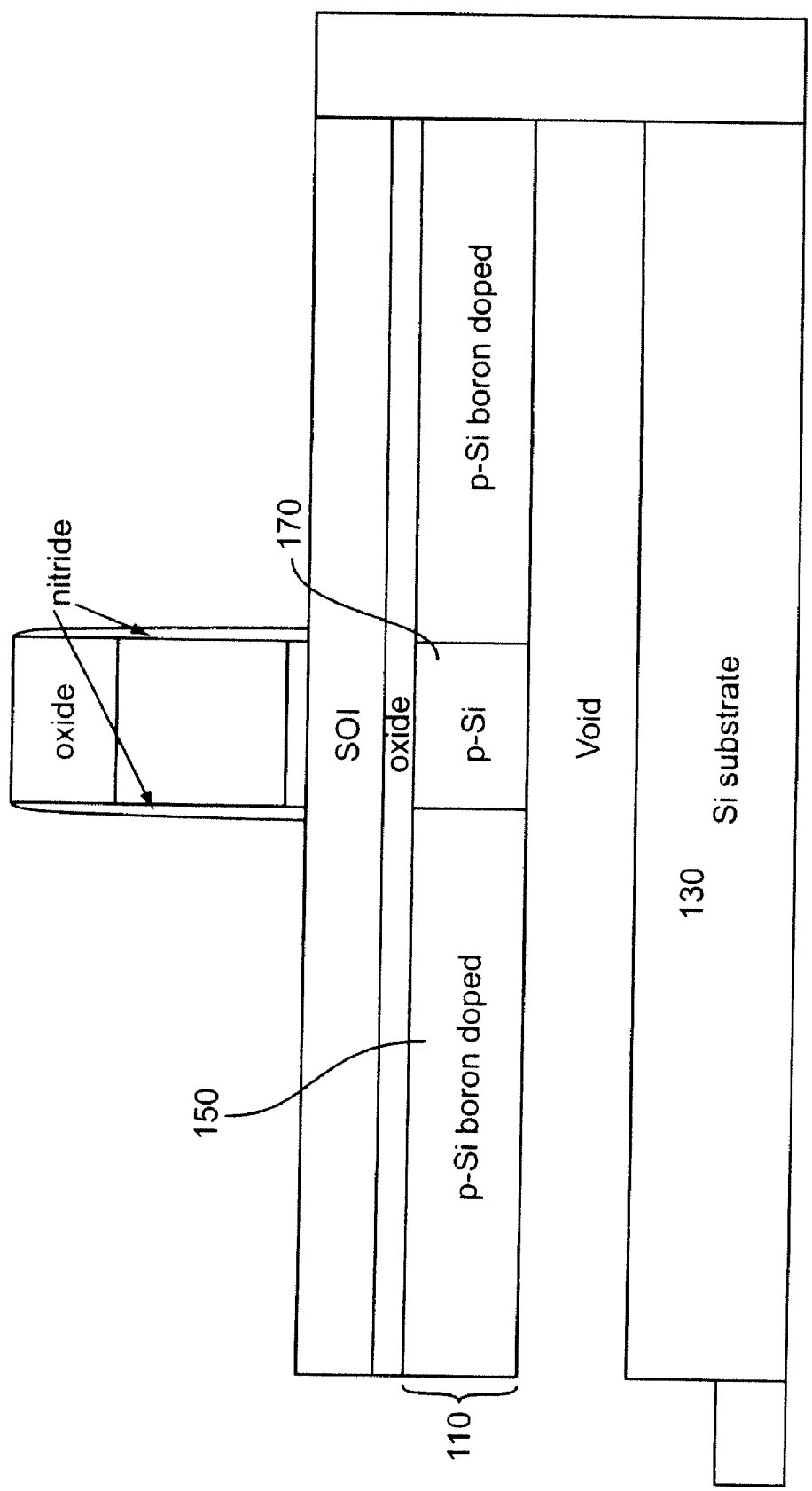

Referring now to FIG. 10, an initial state of the substrate for formation of the second preferred embodiment in shown. Again, as discussed above, layer(s) 10' is illustrated as a SOI or UT-SOI structure but could be any monocrystalline silicon layer. In either case, the structure is preferably bonded to a composite substrate comprising a polycrystalline semiconductor (preferably large grain polysilicon) layer 110, a polycrystalline semiconductor alloy structure (preferably polycrystalline SiGe) layer 120 and a bulk semiconductor layer 130. (The corresponding region in the completed first preferred embodiment has also been labeled with reference numeral 130 in FIG. 1, for purposes of understanding of the basic principles of the invention.) As shown in FIG. 11, a gate structure is formed (as also shown in FIG. 3) but preferably with a comparatively thicker oxide cap to prevent the etch-controlling implantation of boron from being made in the gate electrode region. The boron implantation is made at an energy distribution to distribute boron substantially only in the large grain polysilicon layer 110 and only in the regions outside the gate structure. The boron implant dose is not critical other than to develop an adequate differential etch rate relative to polysilicon for a given etchant. (Boron doped silicon has a reduced etch rate relative to undoped silicon: for example, using a 42% KOH etchant at 60° C., a factor of ten reduction in etch rate is obtained at a boron implant dose of $10^{20}/cm^3$.) At least one insulator-filled trench 140 for shallow trench isolation is also preferably formed at this stage, if not before. Then, as shown in FIG. 12, at least a portion of at least one of the shallow trench isolation structures (for example, 140' at the left of FIG. 12) is etched to a level below the boron doped polysilicon region 150, allowing the polycrystalline SiGe layer 120 to be etched selectively to the silicon layers 110 and 130 above and below it as shown in FIG. 13.

Figure 14:
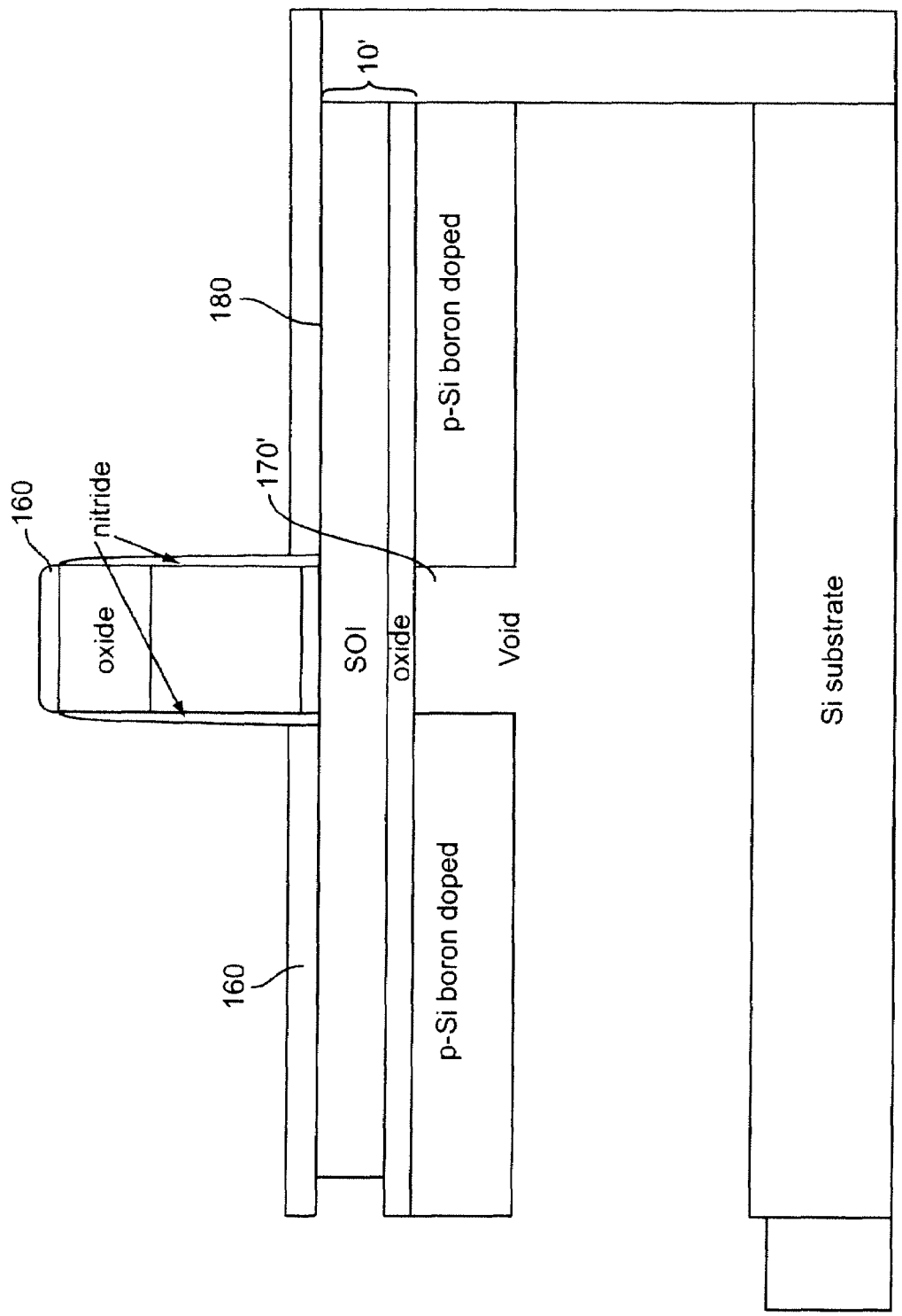
Figure 15:
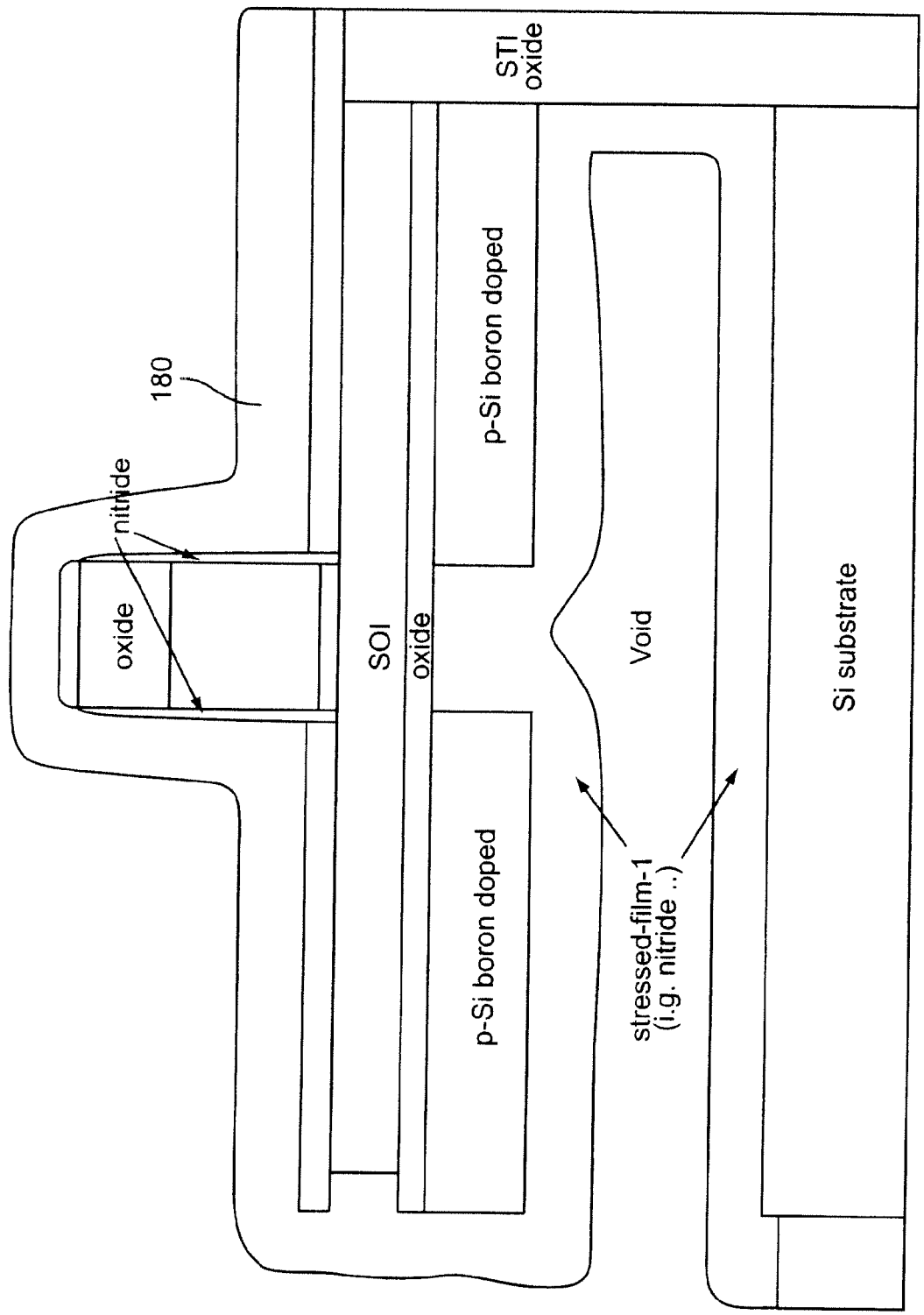
Figure 16:
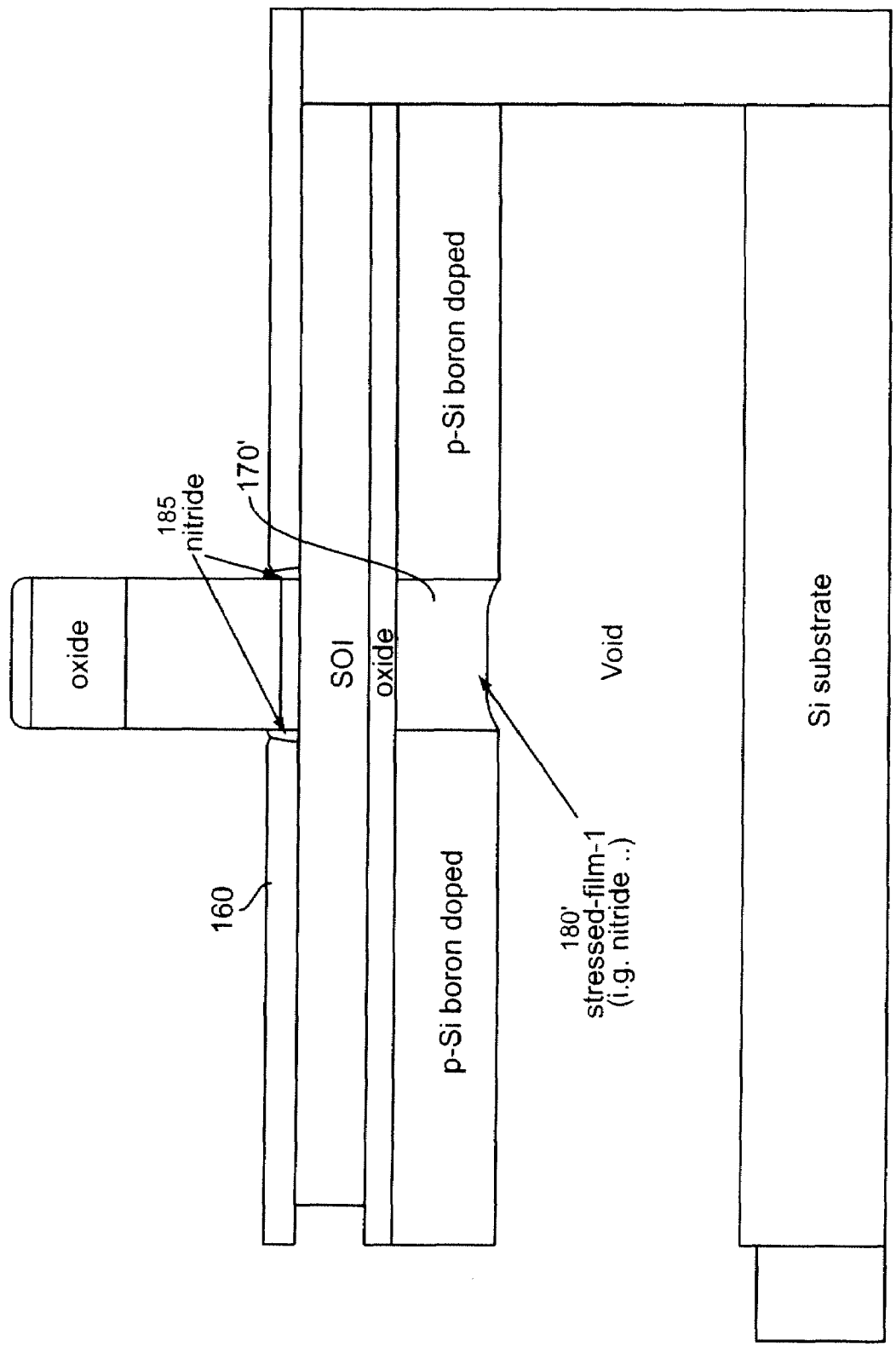

Oxide 160 can then be deposited by any directive deposit technique (e.g. high density plasma (HDP) deposition) on the surface 180 of the SOI structure or layer 10' to mask it from etching when the region 170 of layer 110 masked from the boron implantation is removed by selective etching to form additional void 170' as shown in FIG. 14. Then, as shown in FIG. 15, a first stressed film, compressive for nFETs and tensile for pFETs, preferably a known tensile or compressive nitride such as cobalt nitride or palladium nitride, is deposited, generally conformally, over the entire exposed surface including the interior exposed through the etched STI structure discussed above. It should be noted that the preferred stressed films generally tend to fill surface irregularities such as void region 170' preferentially; providing an increased thickness in such regions. Thus when nitride is selectively and anisotropically etched, as shown in FIG. 16, a deposit 180' of the first stressed film 180 will remain in region 170'. As an incident of this process, it should be noted that nitride sidewalls on the gate structure will be removed to approximately the surface of the protective oxide 160 as also shown in FIG. 16. This remaining portion of the sidewall is not important to the principles of the present invention but may affect sidewall or implant geometry of the transistor during later processes after the protective oxide 160 is removed. As long as the nitride is very thin (e.g. less than 5-10 nm), the effect will be very small.

Figure 17:
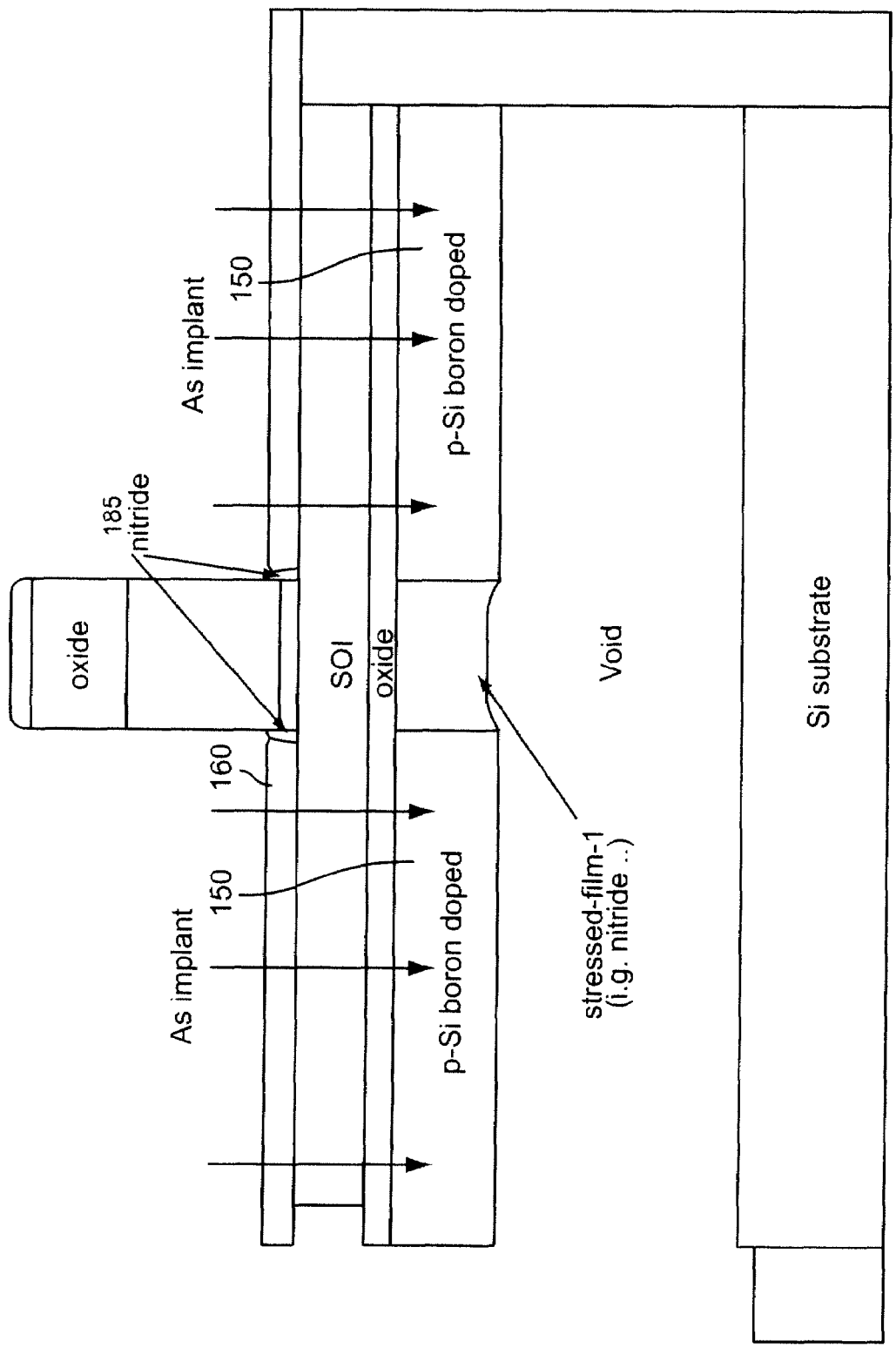
Figure 18:
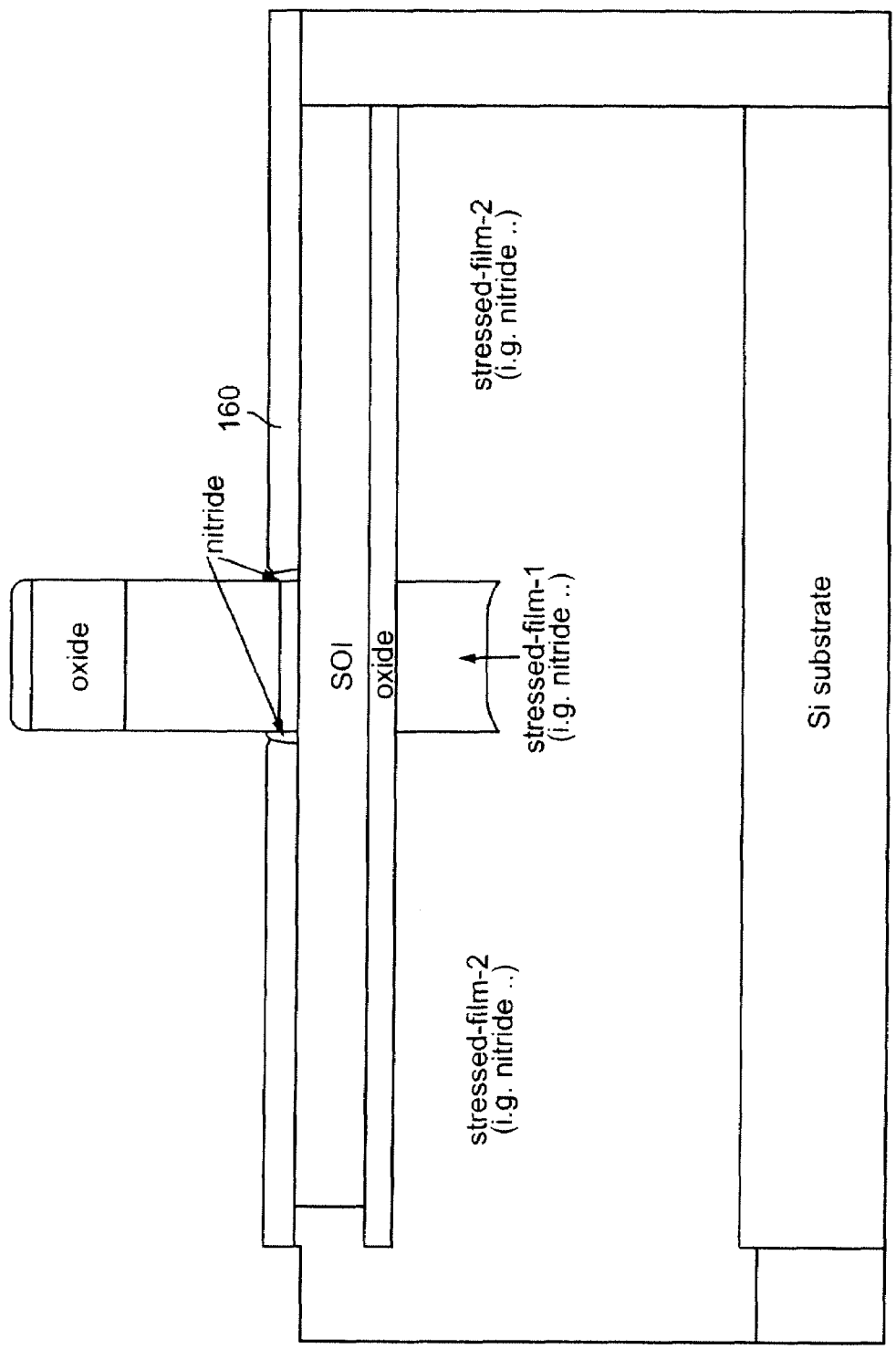
Figure 19:
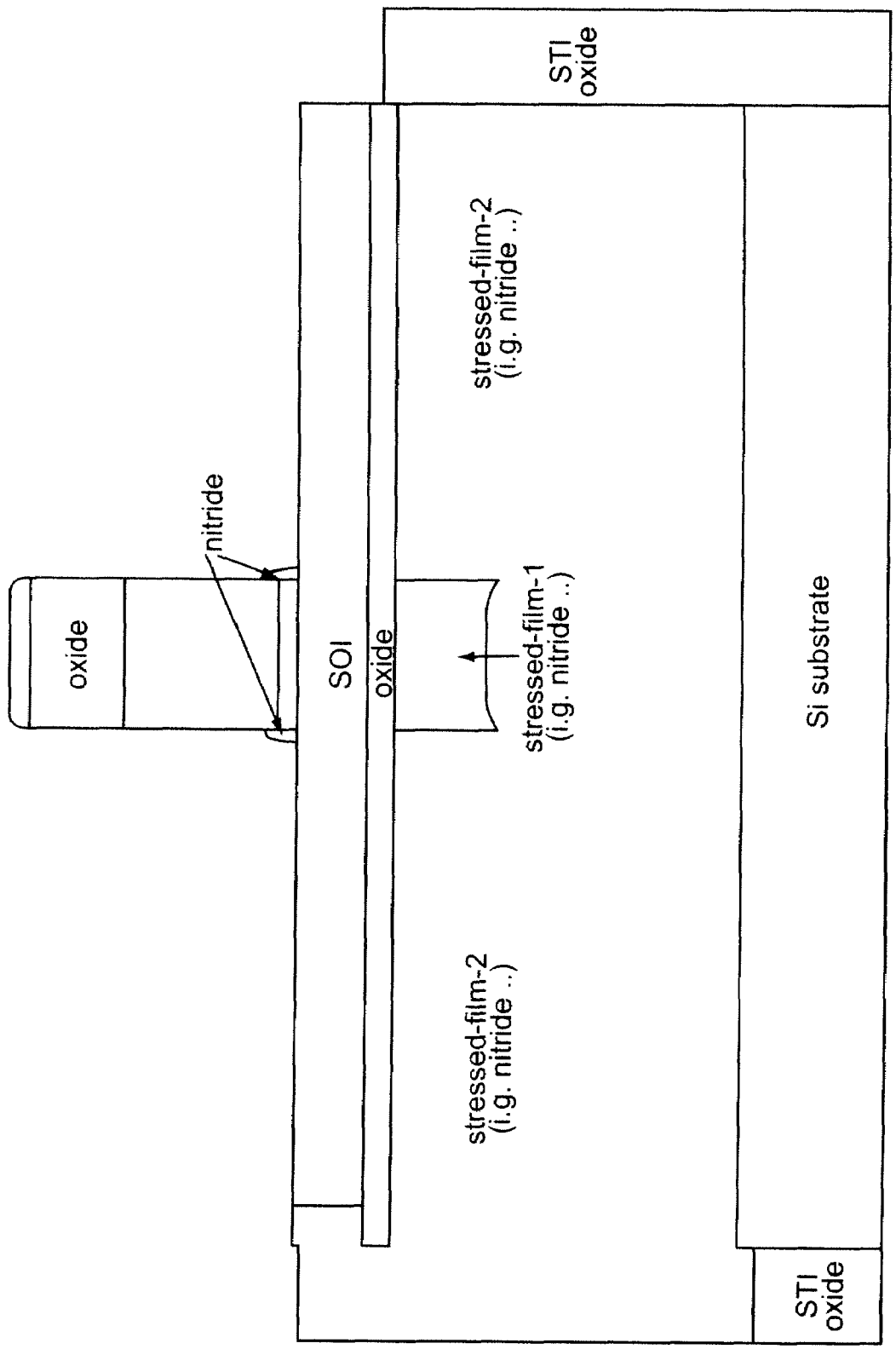

Then, as shown in FIG. 17, an implant of arsenic is made self aligned with the gate structure into the p-Si boron doped regions 150. This implant and masking by the gate is substantially unaffected by nitride 185 since it is thin and of substantially the same thickness as the protective oxide 160. (However, the implantation range in or through nitride is about 30% shorter than the implantation range in or through oxide and thus may be significant in some designs. This implant changes the boron doped polysilicon (p-Si) into n-type p-Si in order to selectively etch the p-Si away, preferably using KOH as an etchant selectively to the first stressed nitride film as well as the buried and protective oxides. Then, the void below the buried oxide is filled with a second stressed film having a stress preferably opposite to that of the first stressed film for the respective nFETs and pFETs (e.g. the second stressed film is preferably tensile for nFETs and compressive for pFETs). The opposition of stresses of the first and second stressed films tends to increase the compressive or tensile stresses at the boundaries between tensile and compressive films which, in the case of the exemplary embodiment discussed above, is adjacent the depletion regions at the source and drain diode junctions which advantageously increases carrier mobility preferentially to reduce resistance where resistance is particularly great along the conduction channel of the transistor since the boundaries of the stressed films are self-aligned with the gate structure of the transistor. Then, the protective oxide 160 is preferably removed, as shown in FIG. 19 and the transistor completed by any processes appropriate to its design.

It should be appreciated that the formation of a stressed structure immediately below the SOI or UT-SOI structure and relatively more centrally within the substrate or underlying layer provides more direct and efficient application of stress to the conduction channel of the transistor and thus potentially greater stress levels for increased carrier mobility as compared with previous surface applications of stressed films while reducing any tendency to cause curling of the chip or wafer. Therefore, stresses of about 1-2 GPa can be reliably imposed at the ends of the conduction channel to increase carrier mobility by about 50% to 80% in accordance with the above-described embodiment of the invention. However, even greater stresses and carrier mobility increases may be engendered in accordance with the further embodiment of the invention which will now be described.

As alluded to above, when the SOI structure is very thin (e.g. less than 10 nm, comparable to a currently minimum spacer thickness), the resistance under the spacer area becomes large and degrades device performance. As a partial solution, it has been proposed to form a raised source/drain (RSD) structure close to the gate in order to reduce the resistance. However, this proximity of the source and/or drain to the gate causes undesirable increase of overlap capacitance between the RSD and the gate. For example, for a 30 nm RSD and a 10 nm spacer, the overlap capacitance will increase about 0.08 fF/μm or 25% for a spacer of oxide and about 0.2 fF/μm or 50% for a spacer of nitride. As a practical matter, the resistance cannot be decreased by reducing the length of the high resistance regions because, at the present state of the art, a nitride spacer having a thickness of less than 10 nm cannot be reliably formed. While an oxide spacer can be formed with a thickness of less than 10 nm, such a reduced thickness will cause the device to suffer from increased overlap capacitance. The following third embodiment of the invention, however, reliably provides both reduced resistance and reduced overlap capacitance as compared with raised SD and extension structures proposed to date consistent with acceptable manufacturing yield. It should be noted that while the third embodiment as will be described below is applicable only to pFETs, it is entirely compatible with electron mobility enhancements applicable to nFETs and, in general, resistance due to electron mobility in nFETS is less serious than resistance due to hole mobility in pFETs.

Figure 20:
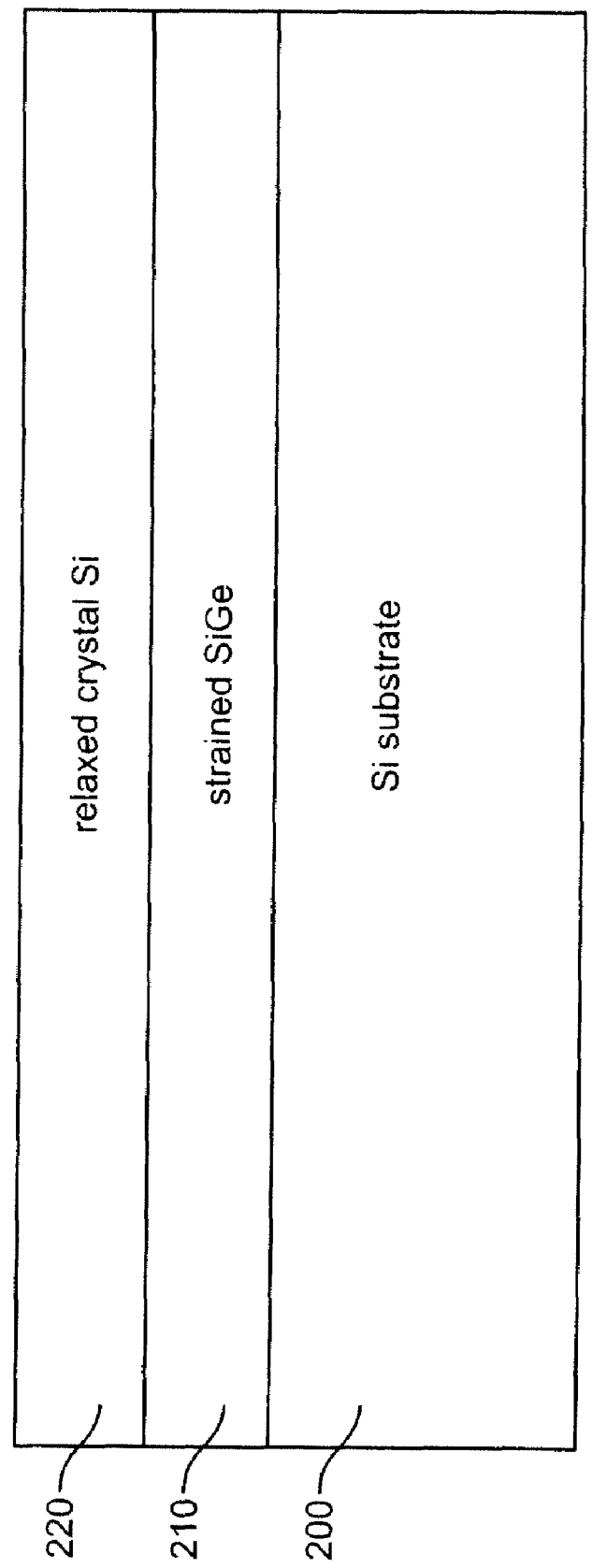

Referring now to FIG. 20 an initial stage of formation of a third embodiment will now be discussed. It should be appreciated that, similarly to the preferred form of the first embodiment and in contrast with the exemplary form of the second embodiment, an SOI structure is not used, resulting in much reduced materials cost, but could be employed, if desired, although some small compromise of the meritorious effects of this third embodiment might be engendered by the additional intervening oxide layer between the transistor and the stressed film. Moreover, as will be explained below, an SOI or SON device or a bulk device can be created, as desired, in conjunction with the formation of the third embodiment of the invention. Accordingly, a bulk semiconductor substrate 200 is preferably provided and covered with a strained SiGe layer 210 and a relaxed (through formation by epitaxial growth of silicon on SiGe, for example) monocrystalline semiconductor (e.g. silicon) layer 220 formed thereover as shown in FIG. 20. It will be appreciated by those skilled in the art that the conduction channel thickness will be limited by the thickness of the layer 220 in much the same manner that the effective channel thickness is limited by oxide/insulator regions 14 in the first embodiment of FIG. 1 and the exemplary SOI structure of the second embodiment; any or all of which can be made very thin.

Figure 21:
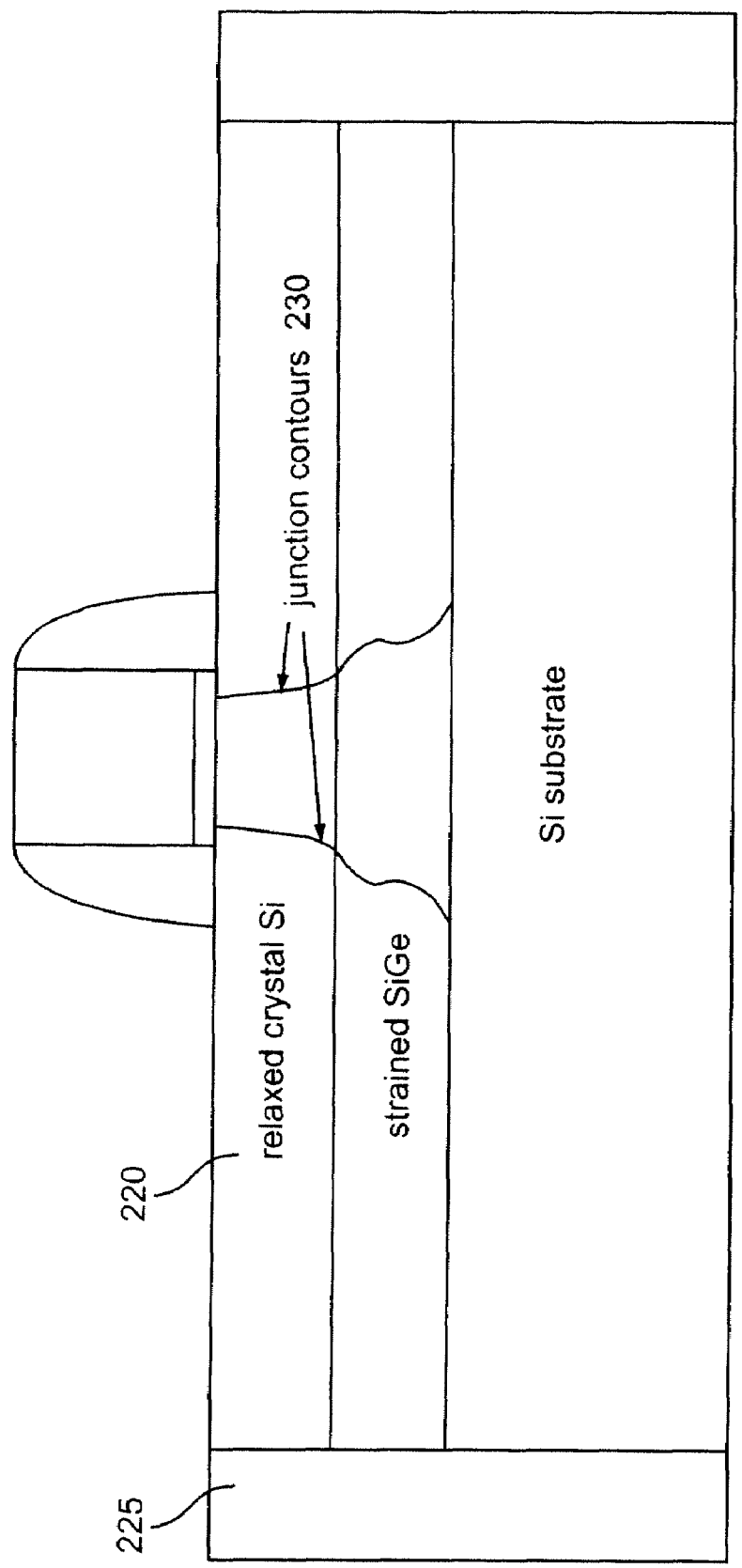

Then, as shown in FIG. 21, isolation trenches (e.g. STI structures 225) are formed and a FET is formed with all dopants in place. As will be appreciated by those skilled in the art, the source and drain diode junctions 230 are thus formed self-aligned with the gate stack and/or spacers formed on the relaxed semiconductor layer 220.

Figure 22:
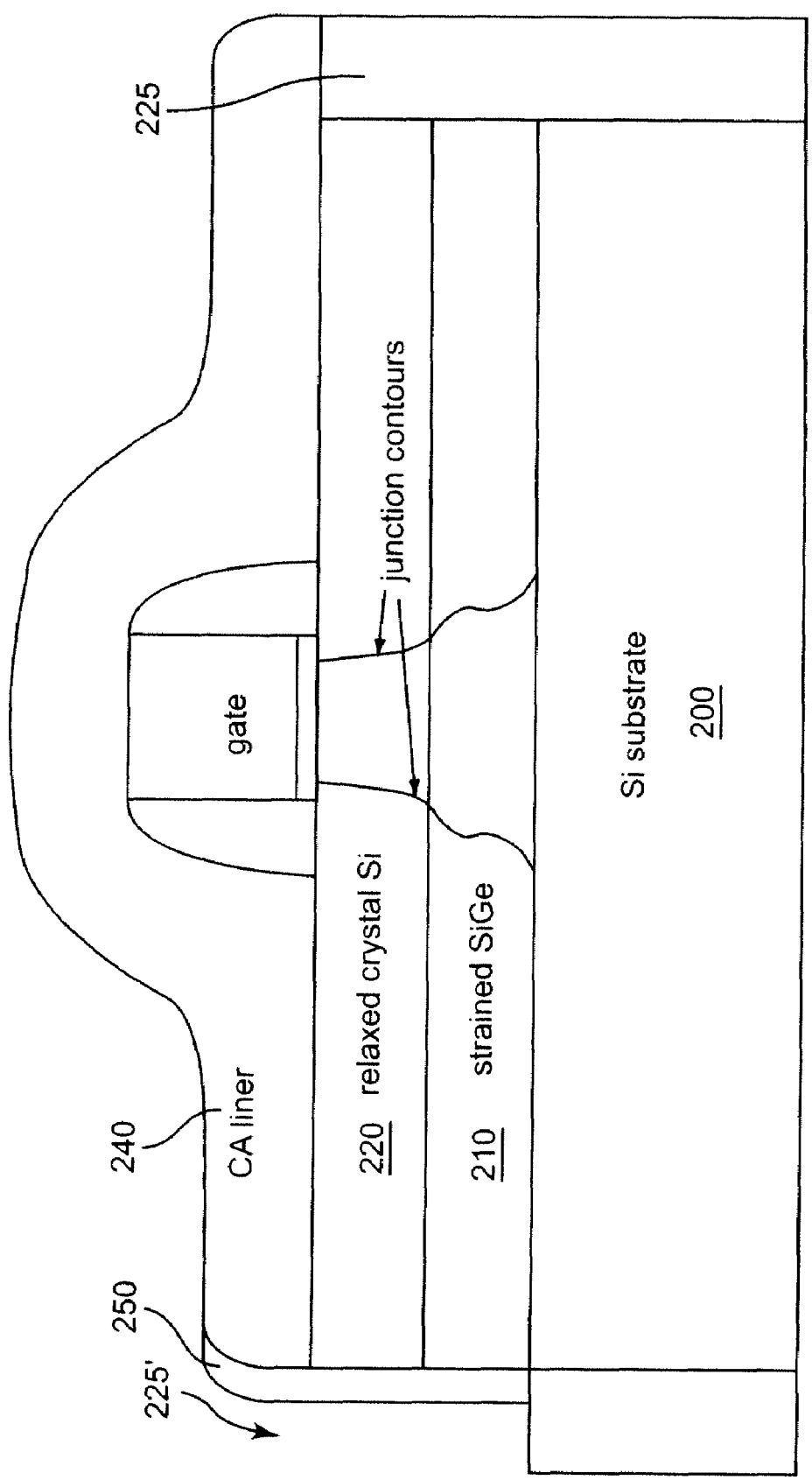
Figure 23:
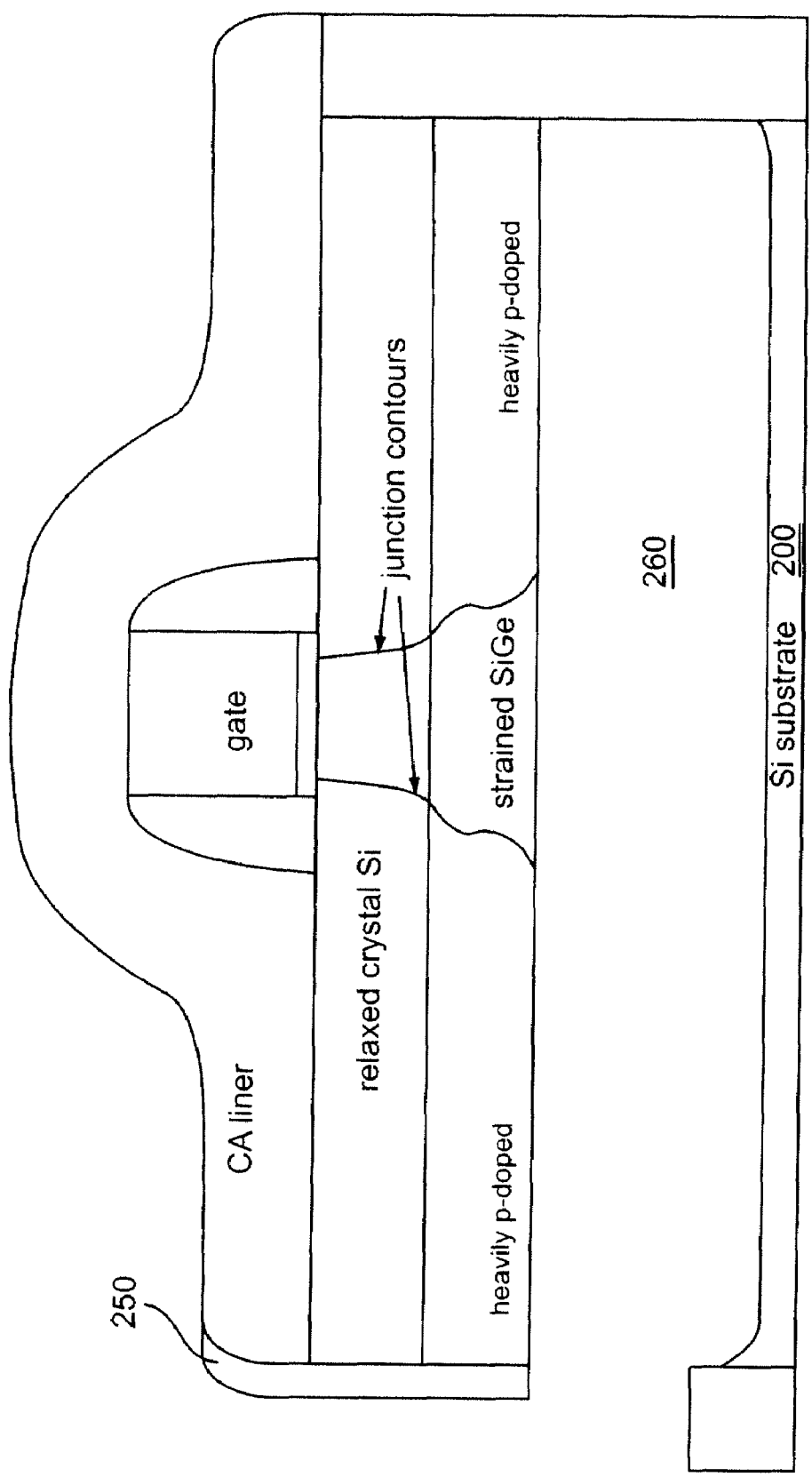
Figure 24:
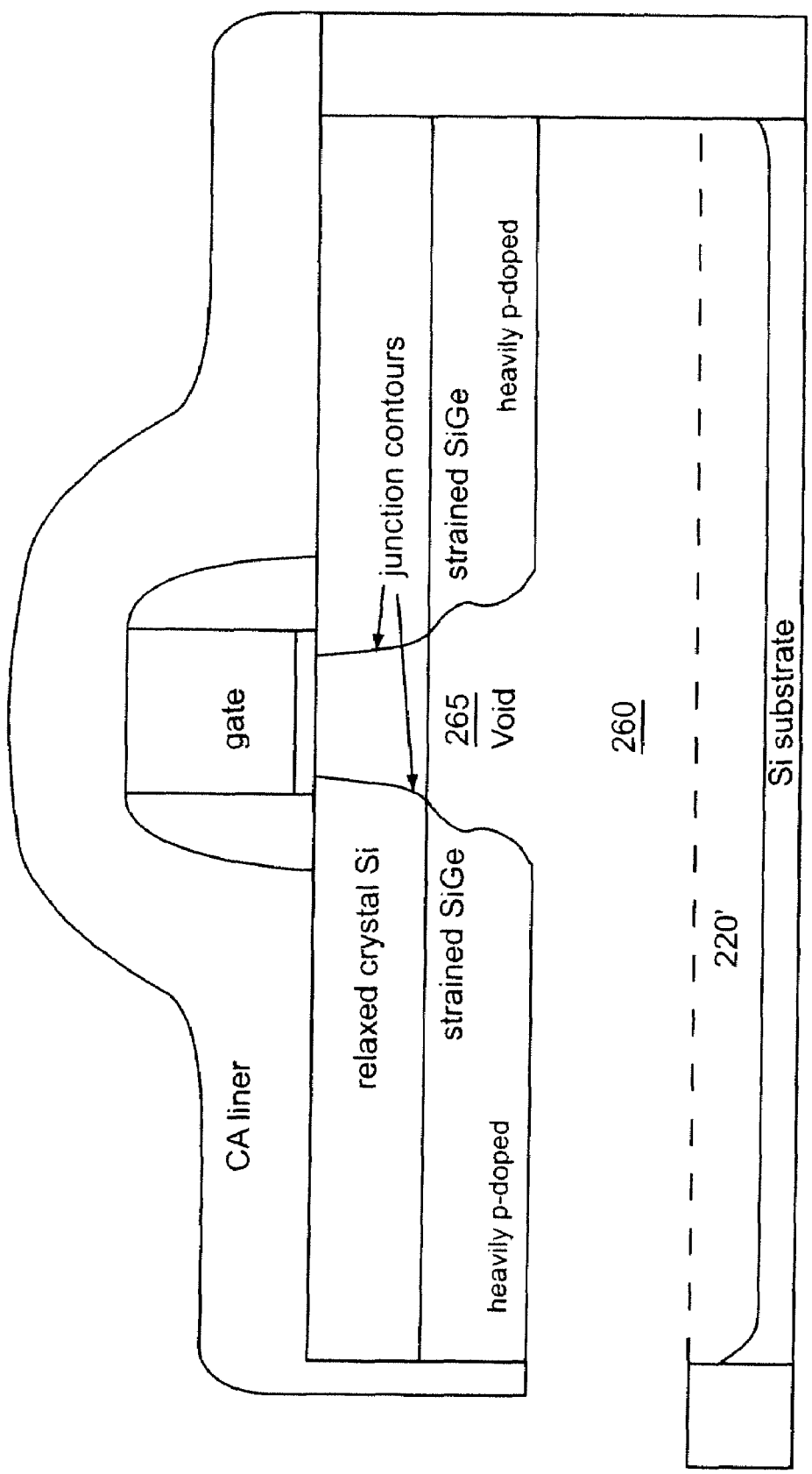

As shown in FIG. 22, a nitride layer 240 is deposited possibly covering one trench 225 and opening at least one trench 225', stopping approximately at the upper level of the substrate or layer 200. Then, a nitride spacer 250 is formed by anisotropic deposition and isotropic etching to cover the ends of layers 210 and 220. Following the formation of the nitride spacer, the selective oxide etch of the STI structure is continued on the left trench to expose the sidewall of the silicon substrate or layer, as shown in FIG. 23. Boron is then implanted into the strained SiGe layer 210 and annealed. Then layer 200 can be etched selectively to the strained SiGe to form void 260. (Optionally, an additional SiGe layer 220' can be provided below the bulk semiconductor layer 200 to obtain a flat plane after wet etch. An SiGe layer, if used, limits the extent of the wet etch depth within the substrate and prevents the wet etch from proceeding deeper than the isolation (e.g. STI) structures which would damage isolation.) Void 260 is then enlarged in region 265 by selective etching of the strained SiGe under the gate which has not been heavily doped by a boron implant self-aligned with the gate structure. When this region of strained material is removed, a discontinuity/boundary is created which can apply stress to the desired ends of the channel of the transistor. The stress in the SiGe will partially be released under the gate and then compressive stress will be formed in the channel to enhance pFET performance. Further, as an incident of the heavy boron implantation and annealing, the boundary of the remaining conductive, heavily-doped, strained SiGe assumes a substantially ogee or staircase profile which improves short channel effects in the transistor as well as providing a recessed E&SD as discussed above. Thus, the third embodiment can provide the "staircase" intra-layer or buried structure profile of the first embodiment (which improves short channel effects and reduces source/drain and extension resistance) in combination with two stressed films self-aligned with the gate to provide increased stress in the transistor channel as well as the possibility of substantially surrounding the transistor with stressed films to avoid stress levels being limited by adhesion limits.

Figure 25A:
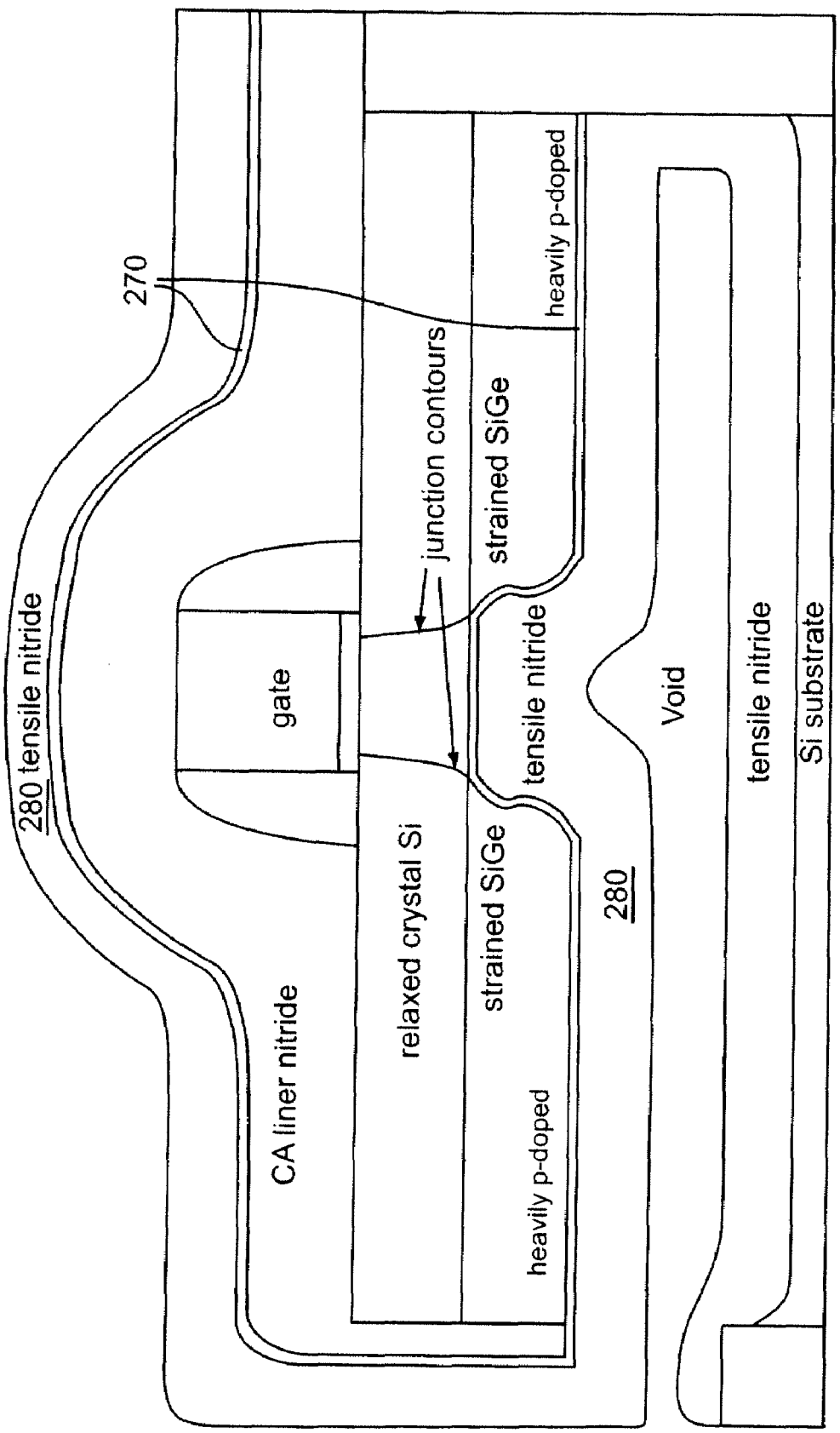

Referring now to FIG. 25A, a thin oxide 270 is deposited to protect the surface under the channel and then a tensile nitride film 280 is deposited to add additional compressive stress to the channel. This stress is efficiently transferred to the channel since the film thus substantially surrounds the transistor both above and below the channel (e.g. but for STI structure 225 which could optionally be opened and stressed film applied therein to even more fully surround the transistor). The thickness of layer 280 may be designed to regulate the amount of stress applied. Those skilled in the art will also appreciate that this configuration of the stress film 280 can apply additional stress beyond the stress which can be applied in shear from a planar or conformal layer as in the second embodiment described above or previously proposed surface applications of the stressed film within the adhesion limits of the film. Further, since the stressed film substantially surrounds the transistor, there is essentially no tendency toward curling of the wafer or substrate. It should also be understood that the stressed film 280 is optional and could be omitted to obtain a SON device of reduced capacitance while still engendering substantial stress in the channel for increased carrier mobility.

Figure 25B:
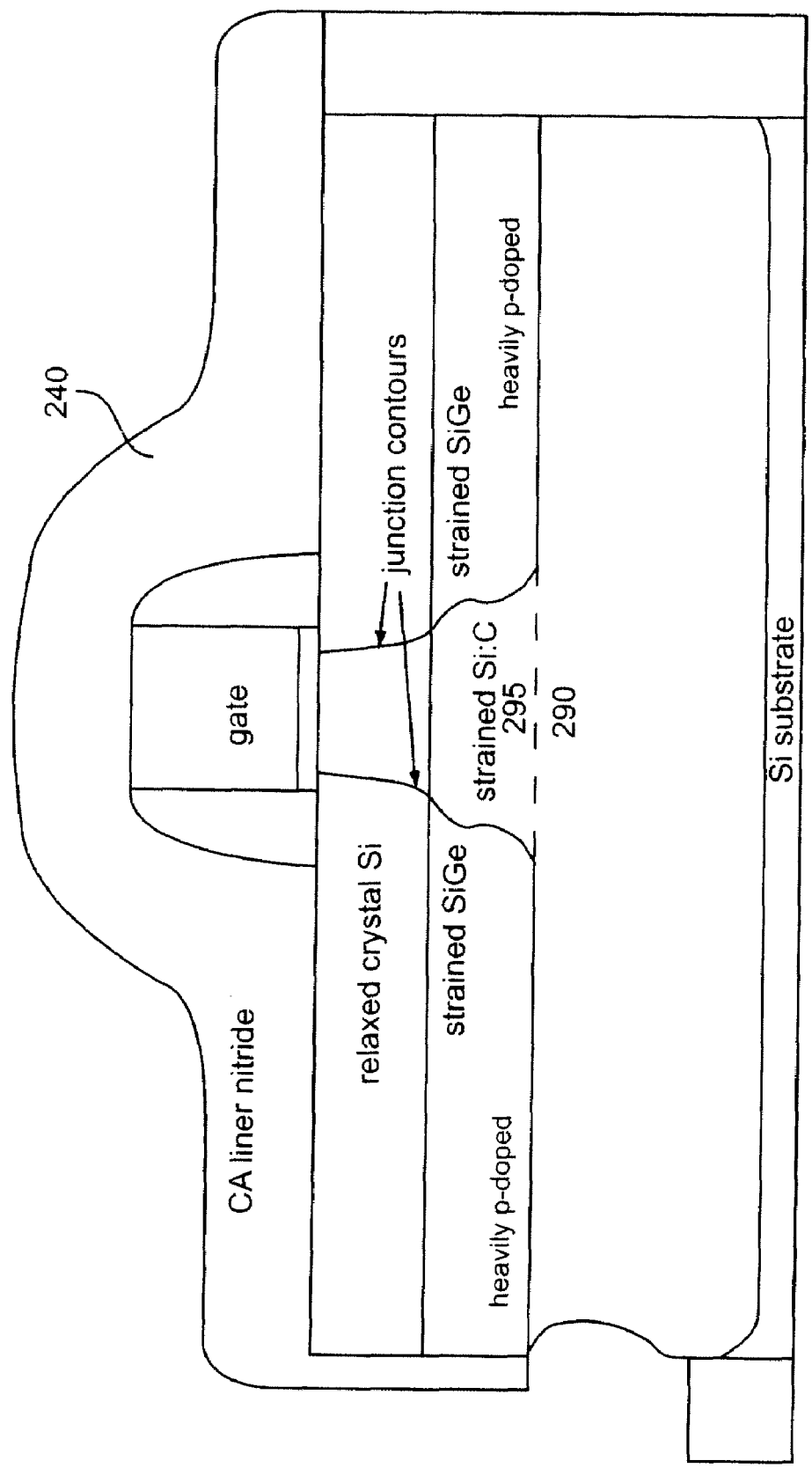

Alternatively, as shown in FIG. 25B, void 260, 265 can be filled with a stressed material such as a strained silicon-carbon alloy (Si:C) 290 by epitaxial growth or the like and direct etching of the fill material on top of the CA liner 240. In this case, the Si:C is not subject to a high temperature process and the stress in the Si:C is maintained. Alternatively, an oxide film can be formed and etched to leave oxide on the SiGe surface while opening the surface of the silicon layer 220 under the channel (due to the more rapid growth of oxide on SiGe than on silicon as in the first embodiment) to prevent the Si:C alloy from growing from the SiGe to enhance channel stresses and improve short channel effects.

Figure 26:
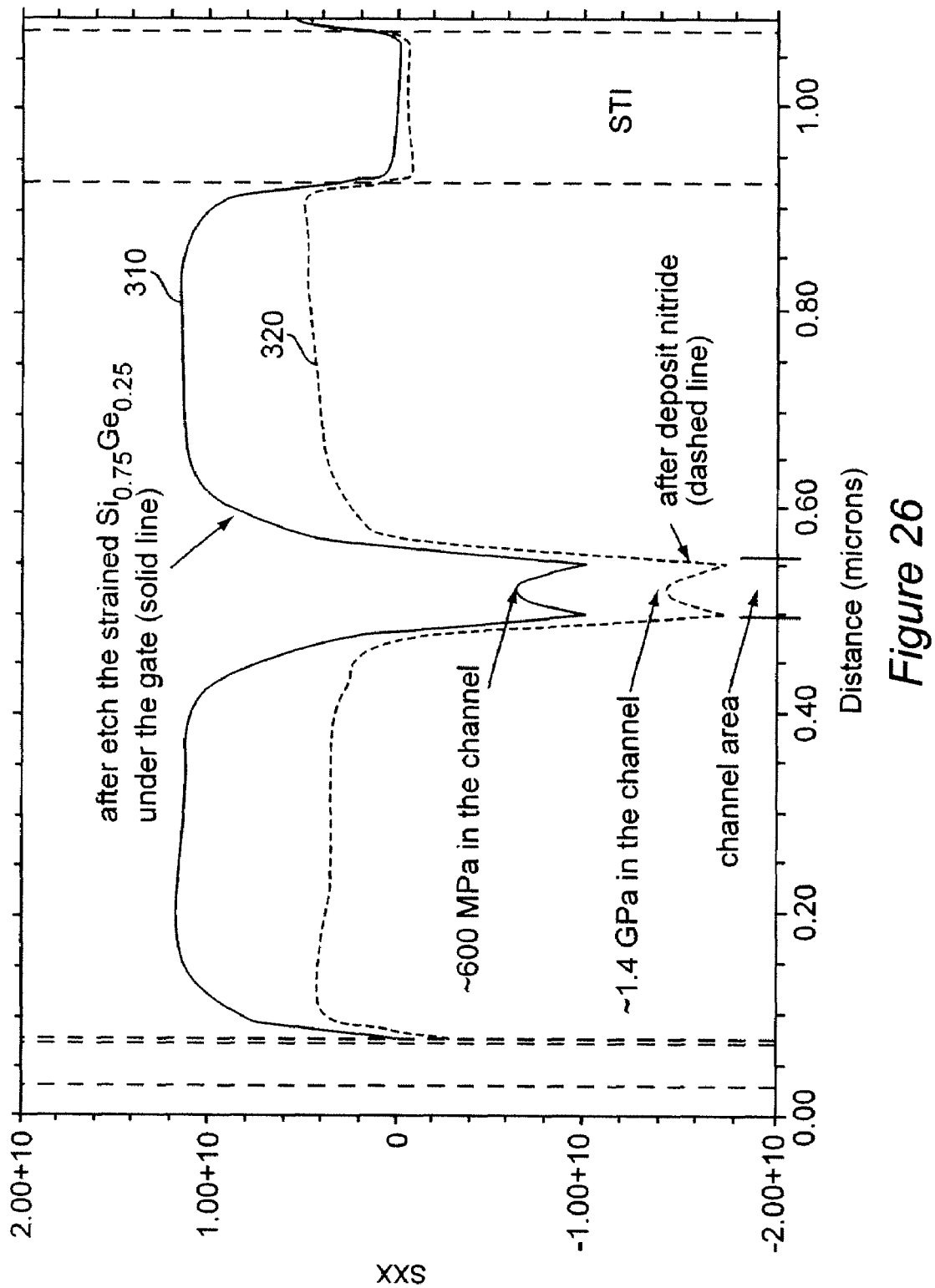

The comparative meritorious effects of these variant forms of the third embodiment of the invention are graphically illustrated in FIG. 26. FIG. 26, for clarity, shows only compressive stress along the 10 nm thickness of the channel at 5 nm below the gate oxide after etch of the strained SiGe (solid line 310) and after deposit of 40 nm of stressed nitride (dashed line 320) in which the stress was about 1.5 GPa. The removal of the strained SiGe under the gate produces about 600 MPa of stress in the channel with substantial peaks proximate to the source and drain junctions (as in SON devices) and a substantial contribution and increase of that stress is also clearly attributable to further stressed film deposits (as in SOI and bulk semiconductor devices).

In view of the foregoing, it is seen that the invention provides a structure within a semiconductor substrate or layer and a reliable technique for forming such a structure which has substantial and varied meritorious effects on transistor performance and cost. Costly SOI and UT-SOI substrates can generally be avoided with the SOI/bulk semiconductor hybrid construction of transistors in accordance with the invention while developing comparable and enhanced performance using much less expensive bulk semiconductor substrates while avoiding floating body effects. Channel resistance can be reduced while maintaining an extremely thin and easily controllable conduction channel and without the complexity of RSD structures or increased overlap capacitance.

While the invention has been described in terms of a three preferred embodiments and variants thereon, those skilled in the art will recognize that the invention can be practiced with further modification within the spirit and scope of the appended claims.

Having thus described my invention, what we claim as new and desire to secure by Letters Patent is as follows:

1. A method of forming a hybrid field effect transistor or integrated circuit comprising steps of
    forming a gate structure on a layer of semiconductor material,
    forming a discontinuous layer having a discontinuity aligned with said gate structure, said discontinuity being formed in a void, wherein said void is formed within a second layer of semiconductor material underlying said layer of semiconductor material on which said gate structure is formed.

2. The method as recited in claim 1, wherein said gate structure is formed on a surface of said layer of semiconductor material.

3. The method as recited in claim 1 wherein a dimension of said discontinuity is defined in said layer of semiconductor material using said gate structure as an implantation mask.

4. The method as recited in claim 3, including a further step of
    forming an insulator within said discontinuity.

5. The method as recited in claim 4, including a further step of
    forming epitaxial semiconductor material within said void.

6. The method as recited in claim 1, including a further step of
    forming an insulator within said discontinuity.

7. The method as recited in claim 6, including a further step of
    forming epitaxial semiconductor material within said void.

* * * * *